(12) United States Patent
Landesberger et al.

(10) Patent No.: US 11,570,898 B2
(45) Date of Patent: Jan. 31, 2023

(54) MULTI-LAYER 3D FOIL PACKAGE

(71) Applicant: Fraunhofer-Gesellschaft zur Förderung der angewandten Forschung e.V., Munich (DE)

(72) Inventors: Christof Landesberger, Munich (DE); Erwin Yacoub-George, Munich (DE); Martin König, Munich (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 17/112,009

(22) Filed: Dec. 4, 2020

(65) Prior Publication Data

US 2021/0176864 A1 Jun. 10, 2021

(30) Foreign Application Priority Data

Dec. 10, 2019 (DE) ...................... 10 2019 219 238.6

(51) Int. Cl.
*H05K 1/14* (2006.01)
*H05K 1/18* (2006.01)
(Continued)

(52) U.S. Cl.
CPC ........... *H05K 1/188* (2013.01); *H05K 1/0298* (2013.01); *H05K 1/05* (2013.01); *H05K 2201/0355* (2013.01)

(58) Field of Classification Search
CPC ......... H05K 1/181–188; H05K 1/0298; H05K 1/02; H05K 2201/0355; H05K 1/144–145
See application file for complete search history.

(56) References Cited

U.S. PATENT DOCUMENTS 6,313,522 B1   11/2001   Akram et al.
7,365,416 B2 *  4/2008   Kawabata ............. H01L 21/486
                                                   257/686
(Continued)

FOREIGN PATENT DOCUMENTS

JP   2007221118 A    8/2007
TW      504814 B   10/2002
TW   201017865 A    5/2010

OTHER PUBLICATIONS

European Search Report dated May 27, 2021, issued in application No. EP 20212030.9.
(Continued)

*Primary Examiner* — Hoa C Nguyen
(74) *Attorney, Agent, or Firm* — McClure, Qualey & Rodack, LLP

(57) ABSTRACT

The invention relates to a multi-layer 3D foil package and to a method for manufacturing such a multi-layer 3D foil package. The 3D foil package has a foil substrate stack having at least two foil planes, wherein a first electrically insulating foil substrate is arranged in a first foil plane, and wherein a second electrically insulating foil substrate is arranged in a second foil plane, wherein the first foil substrate has a first main surface region on which at least one functional electronic component is arranged, wherein the second foil substrate has a cavity having at least one opening in the second main surface region, wherein the foil substrates within the foil substrate stack are arranged one above the other such that the functional electronic component arranged on the first foil substrate is arranged within the cavity provided in the second foil substrate.

19 Claims, 10 Drawing Sheets

(51) Int. Cl.
    *H05K 1/02*           (2006.01)
    *H05K 1/05*           (2006.01)

(56) References Cited

U.S. PATENT DOCUMENTS

| | | |
|---|---|---|
| 9,271,388 B2 * | 2/2016 | Hsu .................... H01L 23/4334 |
| 10,756,054 B1 * | 8/2020 | Huang .................... H01L 23/13 |
| 2001/0005313 A1 * | 6/2001 | Muramatsu ............ H05K 1/141 |
| | | 361/768 |
| 2003/0112610 A1 | 6/2003 | Frankowsky et al. |
| 2005/0112798 A1 | 5/2005 | Bjorbell |
| 2005/0269681 A1 | 12/2005 | Asahi et al. |
| 2008/0036065 A1 | 2/2008 | Brunnbauer |
| 2009/0129037 A1 * | 5/2009 | Yoshino ................. H05K 1/186 |
| | | 361/761 |
| 2009/0321921 A1 * | 12/2009 | Hwang ................. H05K 3/007 |
| | | 257/701 |
| 2016/0079214 A1 | 3/2016 | Caskey et al. |
| 2017/0133308 A1 * | 5/2017 | Inaba .................... H01L 23/492 |

OTHER PUBLICATIONS

Chinese language office action dated Jul. 15, 2021, issued in application No. TW 109143471.
Translation of office action dated Jul. 15, 2021, issued in application No. TW 109143471.
Korean Language Office Action in the parallel Korean patent application No. 10-2020-0170557 dated Apr. 26, 2022.

* cited by examiner

MULTI-LAYER 3D FOIL PACKAGE

CROSS-REFERENCE TO RELATED APPLICATION

This application claims priority from German Patent Application No. 10 2019 219 238.6, which was filed on Dec. 10, 2019, and is incorporated herein by reference in its entirety.

BACKGROUND OF THE INVENTION

The invention relates to a multi-layer 3D foil package, i.e. a three-dimensional package, or housing, for electronic devices, semiconductor devices and the like. The inventive 3D foil package serves for setting up three-dimensional electronic systems and, in particular, three-dimensional integrated circuits. The 3D foil package comprises a foil stack having several foil substrates arranged vertically one above the other. This 3D foil package thus serves for three-dimensional system integration and consequently differs from the conventional planar technology. Additionally, the invention relates to a method for manufacturing such a 3D foil package.

In three-dimensional or 3D system integration, individual electronic components are not only arranged horizontally along the direction of extension of the substrate on the same, as is done in planar technology. Rather, in 3D system integration, the electronic components are additionally also arranged vertically one above the other. This means that the electronic components are distributed over several planes.

Three-dimensional integration consequently means the vertical connection (both mechanically and electrically) of devices. The advantages of a three-dimensional integrated electronic system are, among other things, the higher achievable package densities and switching speeds (caused by shorter conduction paths) when compared to two-dimensional systems (planar technology).

A plurality of different 3D integration techniques are known. These are frequently based on utilizing conductive contactings (TSVs—through silicon vias) leading through a wafer substrate perpendicularly. The substrate can be the semiconductor wafer (including the IC elements) itself or an additional interposer wafer made of silicon or glass. In the case of silicon substrates, the conductive via has to be electrically insulated from the surrounding substrate. The technology of manufacturing these vias on wafer substrates is complicated and can only be performed in special semiconductor plants. In the case of glass interposers, insulation is no longer required. However, what remains is the complicated process sequence. Additionally, the very thin glass interposer wafers are highly prone to breaking.

Another disadvantage of the wafer-to-wafer integration techniques is the loss in yield in the 3D stack, since generally all the chip elements on a wafer are contacted, i.e. also those which are not electrically functional.

Chip-to-wafer integration is an alternative, in which already tested ICs are preselected. Substrates in a chip-to-wafer configuration comprise large a topography. This entails the disadvantage that complicated planarization is entailed in each plane.

Another class of 3D integration techniques is based on stacking IC elements one above the other, which are set up and contacted on standard printed circuit board (PCB) material. The relatively high thickness of the printed circuit board planes is problematic in this case, which results in great a package height when stacking and also makes heat dissipation from within the 3D stack difficult.

Single-bed technologies are also known, in which chip elements are embedded within the printed circuit board material. Such PCB modules can basically also be assembled to form a 3D stack, however the disadvantages of great a structural height and poor heat dissipation remain.

Consequently, it would be desirable to provide a 3D stack or three-dimensional package allowing high an integration density while at the same time comprising a very flat structure, which can be produced at low complexity and, consequently, low cost.

SUMMARY

According to an embodiment, a multi-layer 3D foil package may have: a foil substrate stack having at least two foil planes, wherein a first electrically insulating foil substrate is arranged in a first foil plane, and wherein a second electrically insulating foil substrate is arranged in a second foil plane, wherein the first foil substrate has a first main surface region on which at least one functional electronic component is arranged, wherein the second foil substrate has a first main surface region and an oppositely arranged second main surface region, wherein at least one functional electronic component is arranged on the first main surface region, and wherein the second foil substrate has a cavity having at least one opening in the second main surface region, wherein the foil substrates are arranged one above the other within the foil substrate stack such that the first main surface region of the first foil substrate is opposite the second main surface region of the second foil substrate and the functional electronic component arranged on the first foil substrate is arranged within the cavity provided in the second foil substrate.

According to another embodiment, a method for manufacturing a multi-layer 3D foil package may have the steps of: providing a first electrically insulating foil substrate and a second electrically insulating foil substrate, arranging at least one functional electronic component on a first main surface region of the first foil substrate, arranging at least one functional electronic component on a first main surface region of the second foil substrate, producing a cavity in the second foil substrate such that this cavity has at least one opening in a second main surface region opposite the first main surface region of the second foil substrate, and forming a foil substrate stack by arranging the first and second foil substrates vertically above each other, wherein the foil substrates are arranged one above the other such that the first main surface region of the first foil substrate is opposite the second main surface region of the second foil substrate and the functional electronic component arranged on the first foil substrate is arranged within the cavity provided in the second foil substrate.

Among other things, the inventive multi-layer 3D foil package comprises a foil substrate stack comprising at least two foil planes. A first electrically insulating foil substrate is arranged in a first foil plane and a second electrically insulating foil substrate is arranged in a second foil plane. Each foil substrate can advantageously be implemented to be single-layered or integral. This means that a foil substrate as described herein can comprise a single-layered foil or be implemented in the form of a single, integral or single-layered foil. The same can apply to the second and any other foil substrate. Foil substrates usually are planar and comprise a (horizontal) main direction of extension. The respective foil plane is directed to be parallel to the main direction of extension of the respective foil substrate. The individual foil planes in turn are stacked one above the other perpendicularly to the main direction of extension. This means that each foil plane extends exemplarily in a planar or horizontal manner and several foil planes are stacked vertically one above the other. The same also applies to the foil substrates arranged in the respective foil planes. This means that the individual planar foil substrates are arranged vertically one above the other within the foil substrate stack so that the result is a three-dimensional foil package having several foil substrate layers. The first foil substrate comprises a first main surface region on which at least one functional electronic component is arranged. The electrical component is arranged directly on the first foil substrate, i.e. without any other substrate or substrate layers arranged therebetween. This may, for example, be a semiconductor chip, IC devices, LEDs, sensors, SMD components and the like. The second foil substrate comprises a first main surface region and an oppositely arranged second main surface region, wherein at least one functional electronic component is arranged on the first main surface region. The electrical component is arranged directly on the second foil substrate, i.e. without any other substrate or substrate layers arranged therebetween. According to the invention, the second foil substrate comprises a cavity having at least one opening in the second main surface region. Thus, the foil substrates within the foil substrate stack are arranged one above the other such that the first main surface region of the first foil substrate is opposite the second main surface region of the second foil substrate, such that the functional electronic component arranged on the first foil substrate is arranged within the cavity provided in the second foil substrate. The functional electronic component may, for example, be a semiconductor chip arranged on the first foil substrate, i.e. is accommodated within the cavity in the overlying second foil substrate. The functional electronic component here can be fit into the cavity in a custom-fit manner or with little backlash. Thus, the topographic protrusion of the functional electronic component on the first foil substrate can be compensated. The second foil substrate thus accommodates in its cavity the functional electronic component of the underlying first foil substrate and thus compensates the topographic protrusion of this functional electronic component. The second foil substrate thus comprises a protrusion reduced considerably when compared to conventional substrates arranged one above the other, not having such a cavity.

Additionally, the invention provides for a corresponding method for manufacturing such a multi-layer 3D foil package. Among other steps, the method comprises providing a first electrically insulating foil substrate and a second electrically insulating foil substrate. At least one functional electronic component is arranged on a first main surface region of the first foil substrate. In addition, at least one functional electronic component is arranged on a first main surface region of the second foil substrate. In accordance with the invention, a cavity is produced in the second foil substrate such that this cavity comprises at least one opening in a second main surface region opposite the first main surface region of the second foil substrate. In addition, a foil substrate stack is produces by vertically arranging the first and second foil substrates above each other, wherein the foil substrates are arranged one above the other such that the first main surface region of the first foil substrate is opposite the second main surface region of the second foil substrate and the functional electronic component arranged on the first foil substrate is arranged within the cavity provided in the second foil substrate. The foil substrates allow a very flat structure. The effect of the flat structure is additionally increased further by arranging the electronic component within the cavity of the opposite foil substrate. In addition, foil substrates can be provided cheaply and are easy to process, which has a further positive influence on the production costs of an inventive 3D foil package.

BRIEF DESCRIPTION OF THE DRAWINGS

Some embodiments are illustrated exemplarily in the drawings and will be discussed below, in which.

DETAILED DESCRIPTION OF THE INVENTION

Figure 1:
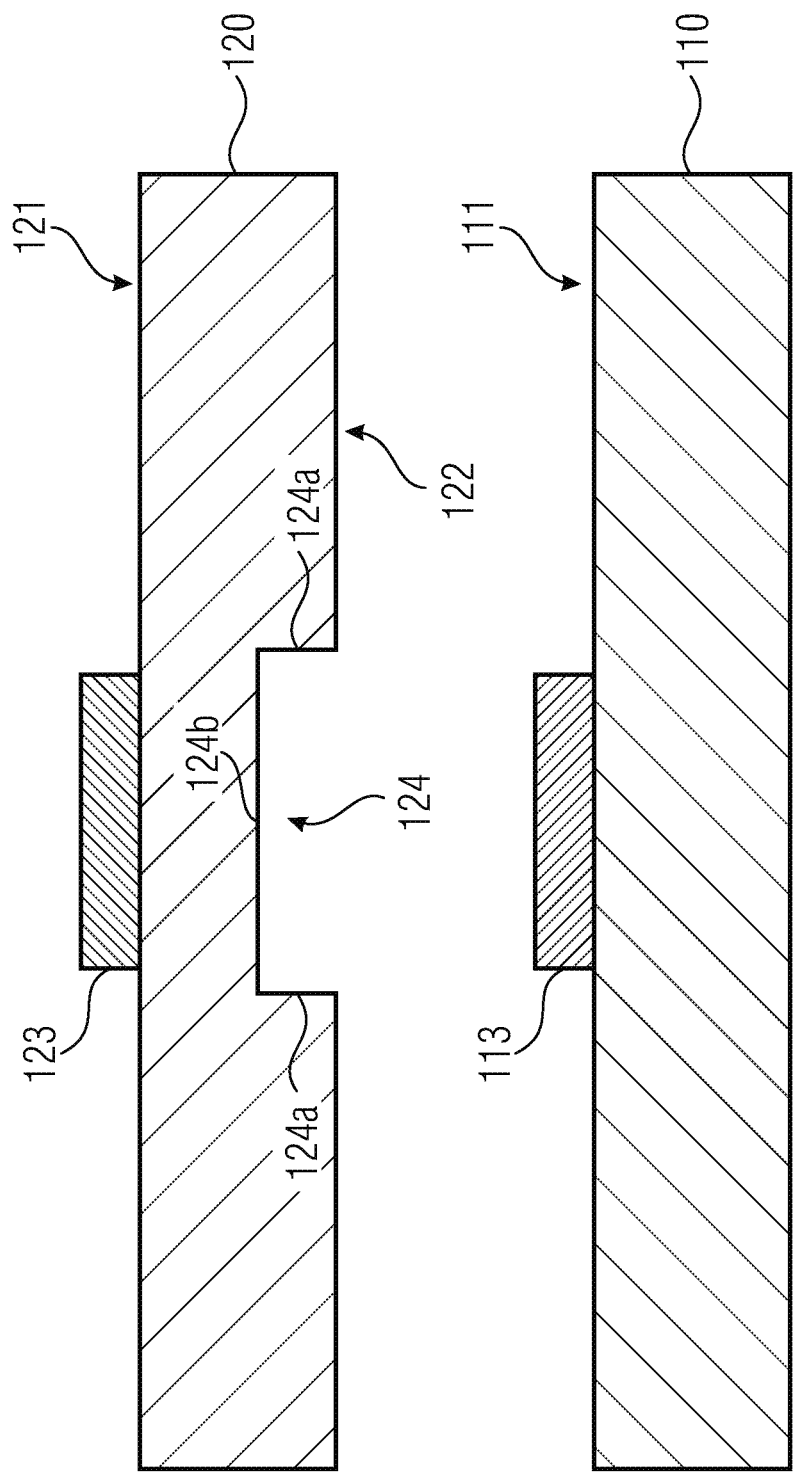
FIG. 1 shows a lateral sectional view of two foil substrates for an inventive 3D foil package in accordance with an embodiment.

In the following, embodiments are described in more detail with reference to the drawings, wherein elements having the same or a similar function are provided with the same reference numerals.

Method steps illustrated in a block diagram and described with reference to the same may also be performed in any other order than illustrated or described. In addition, method steps relating to a certain feature of a device are interchangeable with said feature of the device, and vice versa.

In addition, a functional electronic component will be described exemplarily taking the example of a semiconductor chip, like a silicon chip having an integrated circuit. However, other functional electronic components and devices, like IC devices, LEDs, sensors, SMD components and the like are also conceivable.

Figure 2:
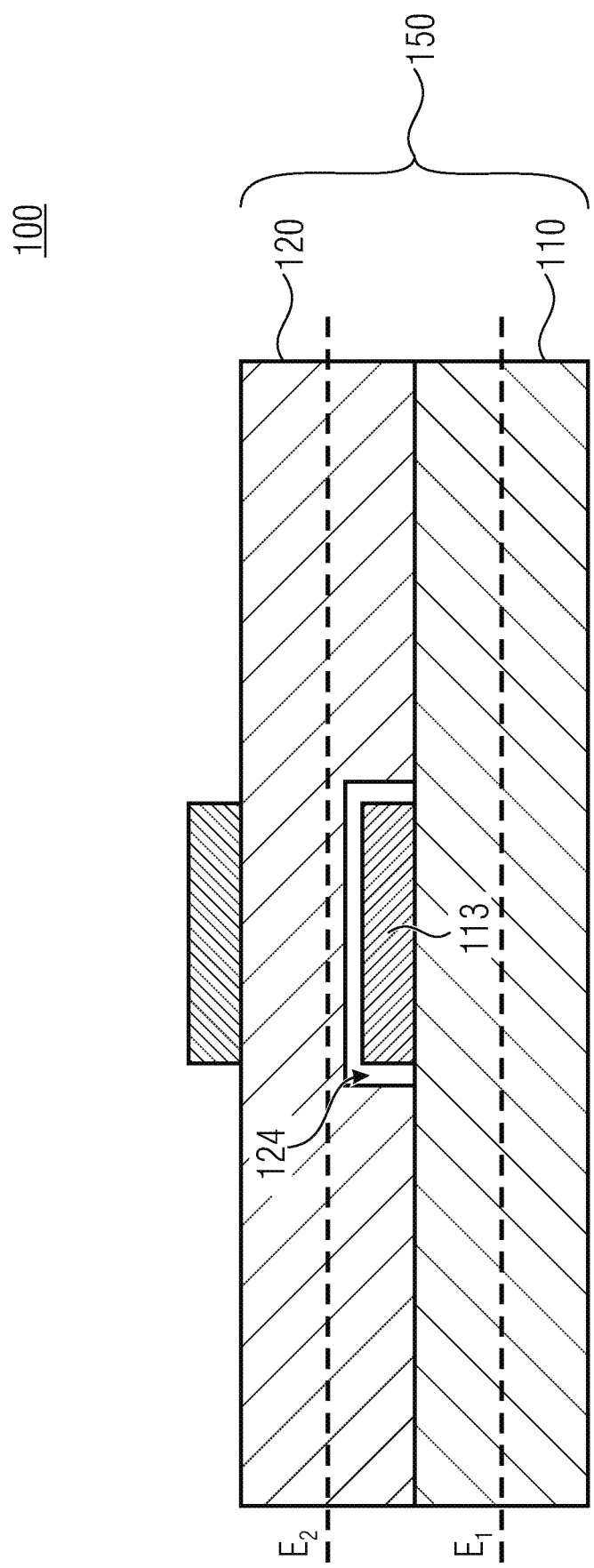
FIG. 2 shows a lateral sectional view of an inventive 3D foil package in accordance with an embodiment.

FIGS. 1 and 2 each show an embodiment of an inventive multi-layer 3D foil package 100. In FIG. 1, for reasons of clarity, the individual foil substrates 110, 120 are illustrated separately from each other. In FIG. 2, a foil substrate stack 150 is shown in which the individual foil substrates 110, 120 are arranged one above the other. Reference is made to both FIGS. 1 and 2 for a discussion of this embodiment.

As mentioned before, the 3D foil package 100 comprises a foil substrate stack 150. The foil substrate stack 150 comprises at least two foil planes $E_1$, $E_2$. A first electrically insulating foil substrate 110 is arranged in the first foil plane $E_1$. A second electrically insulating foil substrate 120 is arranged in the second foil plane $E_2$. This means that, in the foil substrate stack 150, both foil substrates 110, 120 are stacked vertically one above the other, i.e. basically perpendicularly to the foil planes $E_1$, $E_2$. This in turn is a characteristic of three-dimensional system integration.

The first foil substrate 110 comprises a first main surface region 111. At least one functional electronic component 113, for example a semiconductor chip, is arranged on the first main surface region 111. Further functional electronic components can also be arranged on the first foil substrate 110. These can be arranged on the first main surface region 111 of the first foil substrate 110 or in the first foil plane $E_1$, for example in conventional planar technology.

The second foil substrate 120 comprises a first main surface region 121 and an oppositely arranged second main surface region 122. At least one functional electronic component 123, for example a semiconductor chip, is arranged on the first main surface region 121. Further functional electronic components can also be arranged on the second foil substrate 120. These can be arranged on the first main surface region 121 of the second foil substrate 120 or in the second foil plane $E_2$, for example in conventional planar technology.

As can be seen in particular in FIG. 1, the second foil substrate 120 can comprise a cavity 124. The cavity 124 is formed in the second main surface region 122 of the second foil substrate 120. The cavity 124 here comprises at least one opening in the second main surface region 122. This means that the cavity 124 extends starting from the second main surface region 122 of the second foil substrate 120 in the direction of the opposite first main surface region 121 of the second foil substrate 120. As can be recognized in FIGS. 1 and 2, the cavity 124 cannot extend completely, but only partly through the second foil substrate 120.

The cavity 124 can comprise lateral side walls 124a which basically extend perpendicularly to the first and second main surface regions 121, 122 of the second foil substrate 120. In addition, the cavity 124 can comprise a bottom region 124b which basically extends in parallel to the first and second main surface regions 121, 122 of the second foil substrate 120.

As can be seen in particular in FIG. 2, the dimensions of the cavity 124 in the second foil substrate 120 can be as great as or slightly greater than the dimensions of the semiconductor chip 113 on the underlying or opposite first foil substrate 110. This means that the semiconductor chip 113 can be accommodated in the cavity 124.

The two foil substrates 110, 120 can also be arranged in the foil substrate stack 150 one above the other such that the first main surface region 111 of the first foil substrate 110 is opposite the second main surface region 122 of the second foil substrate 120 and the functional electronic component 113 arranged on the first foil substrate 110 is arranged within the cavity 124 provided in the second foil substrate 120.

The multi-layer foil substrate stack 150 has been described using the example of two foil substrates 110, 120 arranged vertically one above the other. The multi-layer foil substrate stack 150 can also comprise more than the purely exemplarily two described foil substrates 110, 120. Here, each further foil substrate can be arranged in a separate foil plane so that the respective foil substrates are stacked vertically one above the other in different foil planes. Each further foil substrate can additionally comprise one or more functional electronic components on its top and one or more cavities on its bottom. Here, the functional electronic components of the one foil substrate can be arranged in the cavity of the respective overlying foil substrate.

Figure 3:
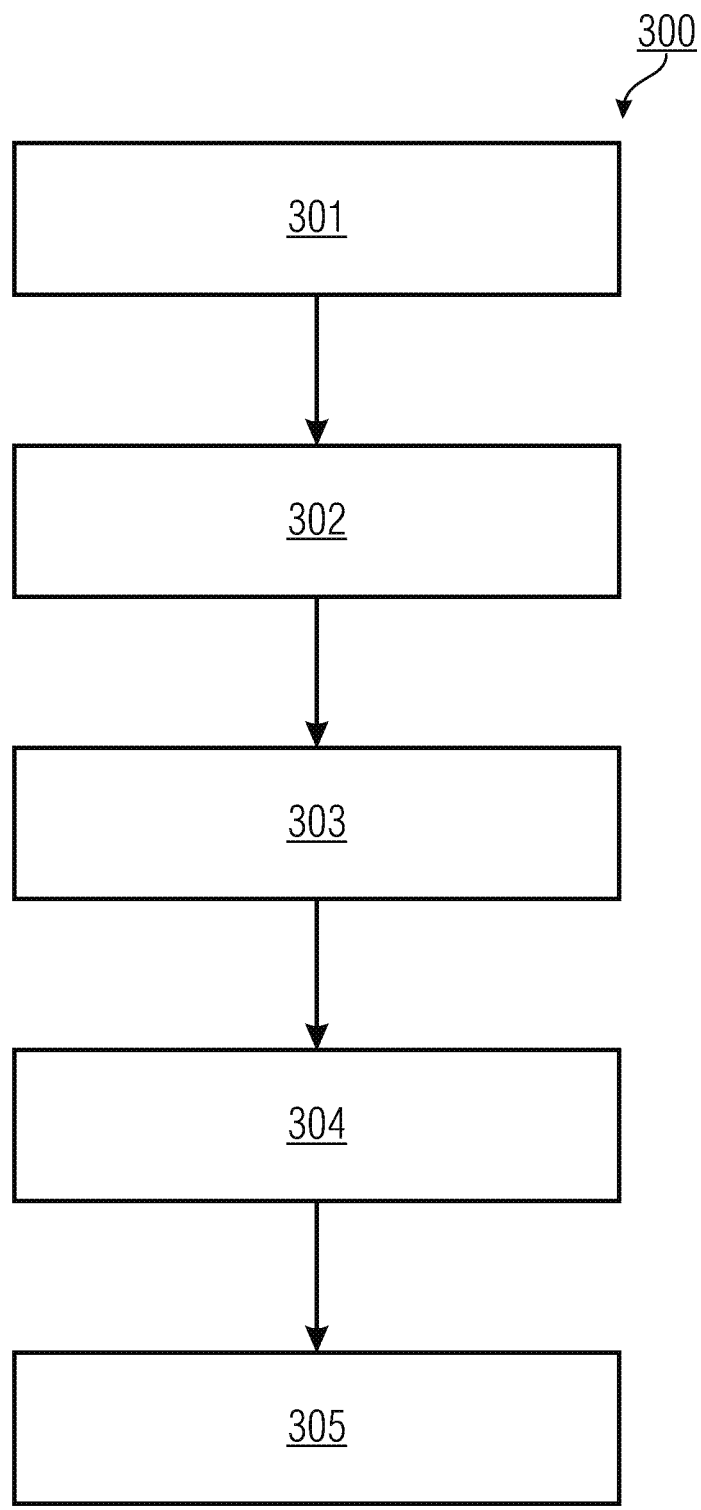
FIG. 3 shows a schematic block diagram for illustrating an inventive method for manufacturing a 3D foil package.

FIG. 3 shows a block diagram for schematically illustrating an inventive method for manufacturing a 3D foil package.

In step 301, the first electrically insulating foil substrate 110 and the second electrically insulating foil substrate 120 are provided.

In step 302, the at least one functional electronic component 113 is arranged on the first main surface region 111 of the first foil substrate 110.

In step 303, the at least one functional electronic component 123 is arranged on the first main surface region 121 of the second foil substrate 120.

In step 304, the cavity 124 in the second foil substrate 120 is produced such that this cavity 124 comprises at least one opening in the second main surface region 122 opposite the first main surface region 121 of the second foil substrate 120.

In step 305, the foil substrate stack 150 is generated by arranging the first and second foil substrates 110, 120 vertically one above the other, wherein the foil substrates 110, 120 are arranged one above the other such that the first main surface region 111 of the first foil substrate 110 is opposite the second main surface region 122 of the second foil substrate 120 and the functional electronic component 113 arranged on the first foil substrate 110 is arranged within the cavity 124 provided in the second foil substrate 120.

Figure 4:
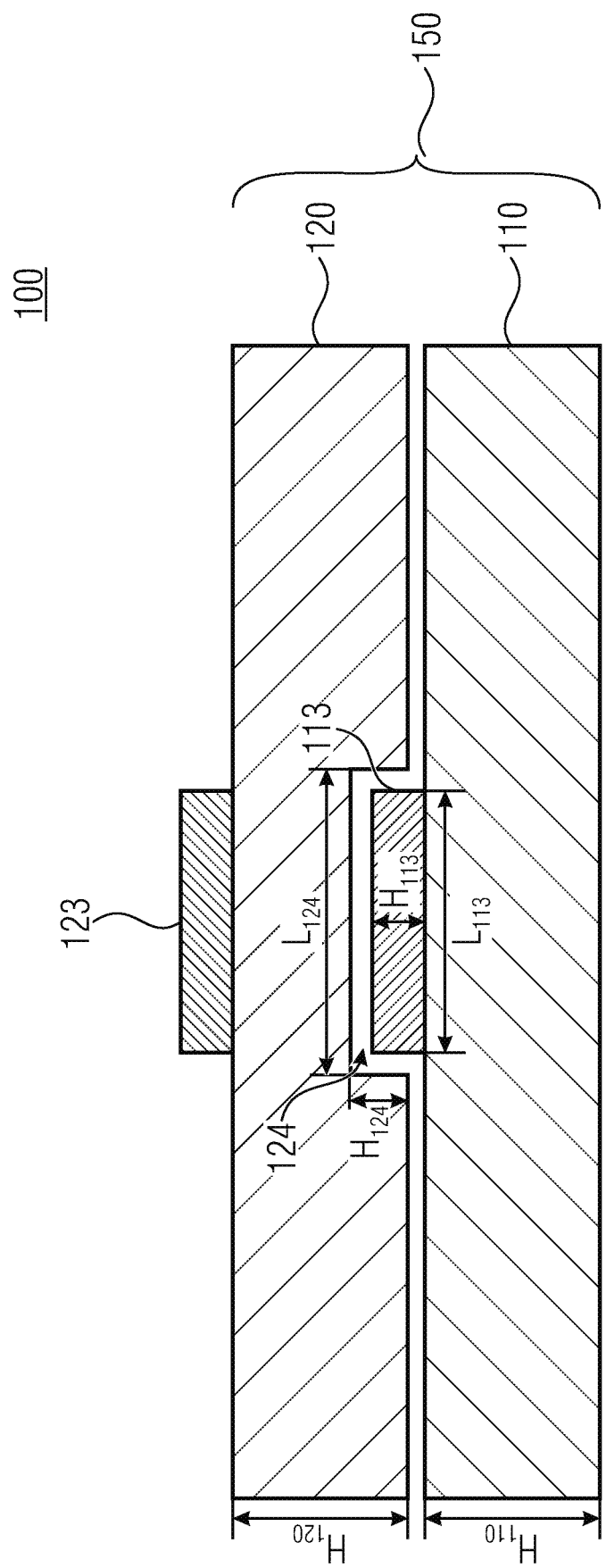
FIG. 4 shows a lateral sectional view of two foil substrates for an inventive 3D foil package in accordance with an embodiment.

FIG. 4 shows a magnified illustration of a multi-layer foil substrate stack 150 in accordance with an embodiment. The first foil substrate 110 comprises a foil layer thickness $H_{110}$. The second foil substrate 120 comprises a foil layer thickness $H_{120}$. The foil layer thicknesses $H_{110}$, $H_{120}$ of the foil substrates 110, 120 can be identical or different. The foil layer thicknesses $H_{110}$, $H_{120}$ can, for example, be between 20 µm and 500 µm, or advantageously between 20 µm and 100 µm.

The functional electronic component 113 arranged on the first main surface region 111 of the first foil substrate 110 comprises a, relative to the first main surface region 111 of the first foil substrate 110, lateral or parallel extension or lateral external contour dimension $L_{113}$, which, in planar technology, would correspond to the length or width of the electronic component 113. The electronic component 113 additionally comprises a, relative to the first main surface region 111 of the first foil substrate 110, vertical dimension $H_{113}$, which, in planar technology, would correspond to the structural height of the electronic component 113. The structural height $H_{113}$ of the electronic component can, for example, be 10 µm to 100 µm or 20 µm to 80 µm and, advantageously, 20 µm to 30 µm.

The cavity 124 formed in the second foil substrate 120 comprises a, relative to the second main surface region 122 of the second foil substrate 120, parallel or lateral extension or lateral internal contour dimension $L_{124}$, which, in planar technology, would correspond to the length or width of the cavity 124. Additionally, the cavity 124 comprises a, relative to the second main surface region 122 of the second foil substrate 120, vertical extension $H_{124}$, which, in planar technology, would correspond to the height or depth of the cavity 124.

A portion of the electronic component 113 which protrudes beyond the first main surface region 111 of the first foil substrate 110 forms a so-called topographic protrusion. In the non-limiting example shown in FIG. 4, the structural height $H_{113}$ forms the topographic protrusion of the electronic component 113.

In accordance with the invention, the cavity 124 provided in the second foil substrate 120 can comprises a volume greater than the volume of the portion of the functional electronic component 113 which protrudes topographically beyond the first main surface region 111 of the first foil substrate 110.

The functional electronic component 113 arranged on the first main surface region 111 of the first foil substrate 110 can thus be arranged laterally completely within the cavity 124 provided in the second foil substrate 120.

Exemplarily, the functional electronic component 113 arranged on the first main surface region 111 of the first foil substrate 110 can comprise a topographic protrusion $H_{113}$ between 10 μm and 100 μm, or between 20 μm and 80 μm. The cavity 124 provided in the second foil substrate 120 can comprise a depth $H_{124}$ which is greater than the topographic protrusion $H_{113}$ of the functional electronic component 113 by 1 μm to 50 μm, or by 1 μm to 30 μm.

Figure 5:
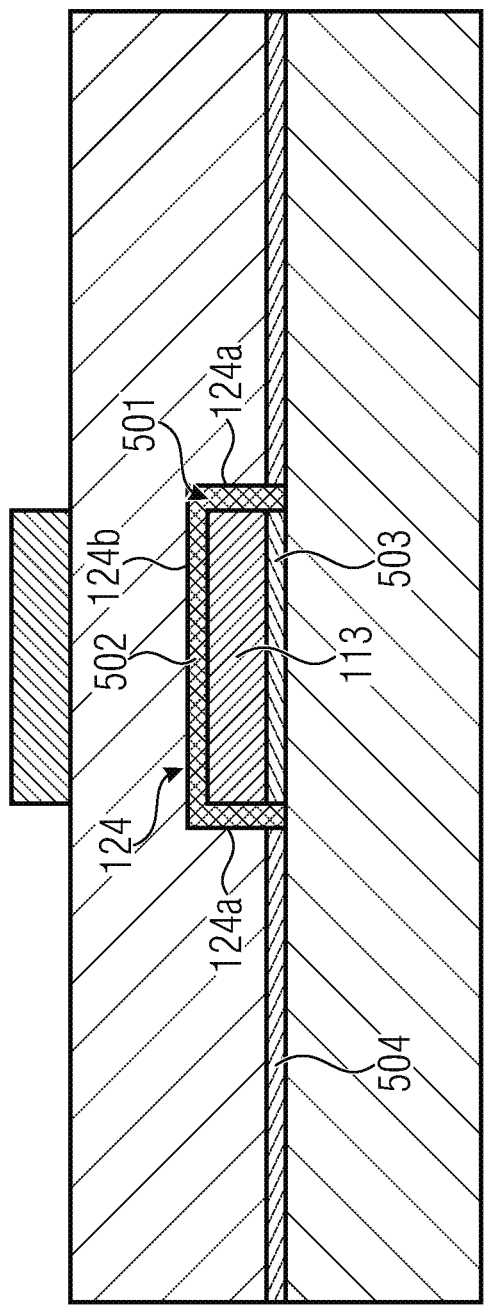
FIG. 5 shows a lateral sectional view of an inventive 3D foil package in accordance with an embodiment.

FIG. 5 shows a further schematic sectional view of an embodiment of a multi-layer 3D foil package 100. As can be seen, there may be a void between the cavity 124 and the external contour of the electronic component 113 arranged in the cavity 124. This void 501 is the greater, the greater the cavity 124 in relation to the electronic component 113, or the more the volume of the cavity 124 differs from the volume of the electronic component 113.

This void 501 can exemplarily result between an external contour of the electronic component 113 and one of the lateral side walls 124a described before referring to FIG. 1 and/or the bottom region 124 of the cavity 124. The void 501 can be filled by a filler 502, for example, a polymer. The filler 502 can exemplarily be arranged between the bottom region 124b of the cavity 124 and the opposite top side of the electronic component 113 (see, for example, FIG. 10), wherein the void 501 in this case would be filled incompletely by the filler 502. However, as is exemplarily illustrated in FIG. 5, the void 501 can also be filled completely by the filler 502. The filler 502 can consequently fill the void 501 between at least one, or all of the, external contour/s of the functional electronic component 113 and a wall 124a, 124b of the cavity 124 opposite the respective external contour, at least in portions and, advantageously, completely.

The functional electronic component 113 can be applied on the foil substrate 110 for example by means of a conductive adhesive 503, like, for example, ACA (anisotropic conductive adhesive) or ACF (anisotropic conductive film) or in flip-chip bonding technology by means of solder connections and underfill material.

In flip-chip bonding, the area of the cavity 124 should be so great that the foil substrate 110 is pushed through onto the underlying bond plate when the electronic component 113 is mounted from above. In other words, a distance between an external contour of the electronic component 113 and an opposite wall, in particular with respect to the bottom region 124b, of the cavity 124 is to be selected to be sufficiently great so as to allow pushing through of the foil substrate 110.

The individual foil substrates 110, 120 arranged in the foil substrate stack 150 in turn can be connected among one another for example by means of suitable bonding means 504, for example by means of a solderable alloy, by means of (exemplarily patterned) conductive adhesive or by means of a thermo-compression-bonded metal connection. The step of connecting the individual foil substrates 110, 120 within the foil substrate stack 150 can, for example, be performed by means of printing, dispensing, screen printing or by means of laminating adhesive films.

In addition, both for the purpose of connecting the individual foil substrates 110, 120 within the foil substrate stack 150 and also for the purpose of connecting the electronic components 113 to the foil substrate 110, applying solder or conductive adhesive can, for example, be performed by means of dispensing or by means of stencil printing in multiple use on the respective surface.

The foil substrates 110, 120 can, for example, by connected to each other in a negative pressure environment and, advantageously, in a vacuum environment. This is also referred to as vacuum bonding. Vacuum environment in the sense of the present disclosure is understood to be at a pressure of less than 100 mbar.

The foil substrates 110, 120 can exemplarily be manufactured in a roll-to-roll method or in the form of individual sheets. A foil substrate 110, 120 having at least one electronic component 113, 123 arranged thereon can also be referred to as module, foil module or chip foil module. Connecting the foil substrates 110, 120 can be performed in different ways. Exemplarily, a single module can be arranged on another single module or a single module can be arranged on a sheet comprising several modules, or a sheet-to-sheet method can be applied, wherein a first sheet comprising several modules is connected to a second sheet also comprising several modules. This sheet-to-sheet method may be of advantage for realizing many 3D module stacks or multiple-layer 3D foil packages in one process step.

A corresponding sheet-to-sheet method can exemplarily comprise the following method steps. At first, a plurality of functional electronic components 113 can be arranged on the first main surface region 111 of the first foil substrate 110. In addition, a plurality of functional electronic components 123 can be arranged on the first main surface region 121 of the second foil substrate 120. Another step provides for producing a plurality of cavities 124, wherein this plurality of cavities 124 is produced in the second main surface region 122 of the second foil substrate 120 opposite the first main surface region 121 of the second foil substrate 120. Another step provides for generating a plurality of foil substrate stacks 150 by arranging the first and second foil substrates 110, 120 vertically one above the other, wherein the foil substrates 110, 120 are arranged one above the other such that the first main surface region 111 of the first foil substrate 110 is opposite the second main surface region 122 of the second foil substrate 120 and the functional electronic components 113 arranged on the first foil substrate 110 are arranged within the cavities 124 provided in the second foil substrate 120. Advantageously, one electronic component 113 each from the plurality of electronic components can be arranged within one cavity 124 each from the plurality of cavities. Subsequently, the respective foil substrate stacks 150 generated in this way can be diced to obtain a plurality of multi-layer 3D foil packages 100.

In accordance with the invention, the second foil substrate 120 comprises the cavity 124, wherein single-layered foil substrates have always been described so far. This means that the individual foil substrates 110, 120 can comprise a single-layered foil or be implemented in the form of a single, integral or single-layered foil.

Figure 6:
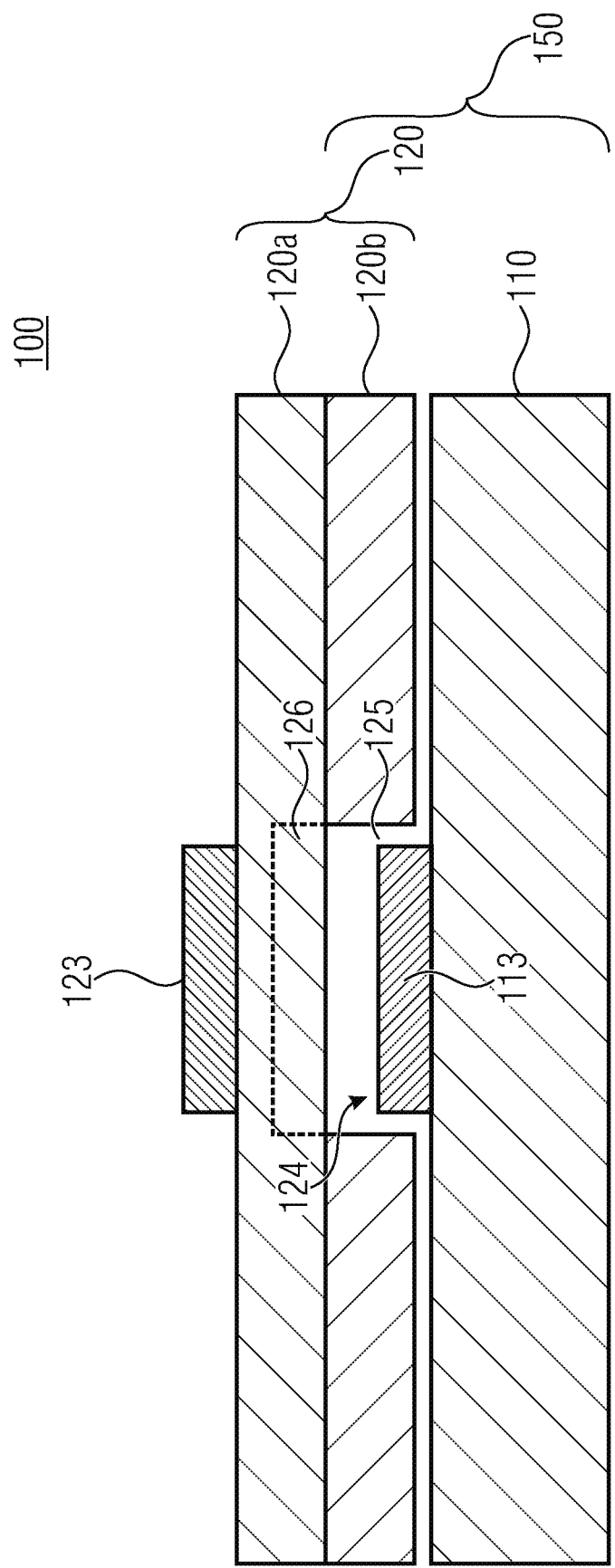
FIG. 6 shows a lateral sectional view of an inventive 3D foil package in accordance with an embodiment.

FIG. 6 shows another example of a multi-layer 3D foil package 100, wherein at least one of the foil substrates (in this example the second foil substrate 120) is implemented to be two-layered or comprise two layers. The foil substrate 120 implemented to be two-layered comprises a first foil substrate layer 120a and a second foil substrate layer 120b. The two foil substrate layers 120a, 120b can be arranged vertically one above the other.

One of the two foil substrate layers 120a, 120b, for example the foil substrate layer 120b arranged opposite the first foil substrate 110, can comprise a continuous window opening 125. A continuous window opening 125 is defined such that the window opening 125 extends completely through the respective foil substrate layer 120*b*. This means that the continuous window opening 125 exposes both main surface regions of the respective foil substrate layer 120*b*.

The respective other foil substrate layer, for example the foil substrate layer 120*a* facing away from the first foil substrate 110, can be implemented not to comprise a window opening or be window opening-less. Embodiments of the invention provide for the foil substrate layer 120*a* facing away from the first foil substrate 110 to comprise a cavity or recess 126, which is indicated by broken lines. This cavity or recess 126 and the window opening 125 can, as is illustrated, be arranged to be congruent one above the other and thus together form the cavity 124 of the second foil substrate 120.

The cavity or recess 126 differs in its definition from the window opening 125 mentioned before in that the cavity 126 does not extend completely through the respective foil substrate layer 120*a*. This means that the cavity 126 exposes only one of the two main surface regions of the respective foil substrate layer 120*a*.

When the foil substrate layers 120*a*, 120*b* of the second foil substrate 120 are arranged, as is illustrated, one above the other, the second foil substrate layer 120*b* comprising the window opening 125, together with the recess 126, indicated in broken lines, in the first foil substrate layer 120*a*, can form the cavity 124 in which the electronic component 113 of the underlying first foil substrate 110 can be arranged.

In the case, described above referring to FIG. 6, of a two-layered foil substrate 120 having two layers or sheets 120*a*, 120*b*, the two layers 120*a*, 120*b* together form the cavity 124, wherein each layer 120*a*, 120*b* comprises a respective recess or cavity of its own. This means that, in both layers 120*a*, 120*b*, there is at least one (maybe continuous) recess or cavity, wherein the recesses in the individual layers 120*a*, 120*b* together form the cavity 12 of the multi-layer foil substrate 120.

The second foil substrate 120 can also be implemented to be a multi-layer or multi-sheet foil substrate which comprises more than the exemplarily described two layers 120*a*, 120*b*. In this case, each individual layer 124 comprises one recess each, wherein all the recesses together form the cavity 124 of the multi-layer or multi-sheet foil substrate 120. This also applies in case the first foil substrate 110 is implemented as a multi-layer or multi-sheet foil substrate. The same applies to any other multi-layer foil substrate maybe present.

Figure 7:
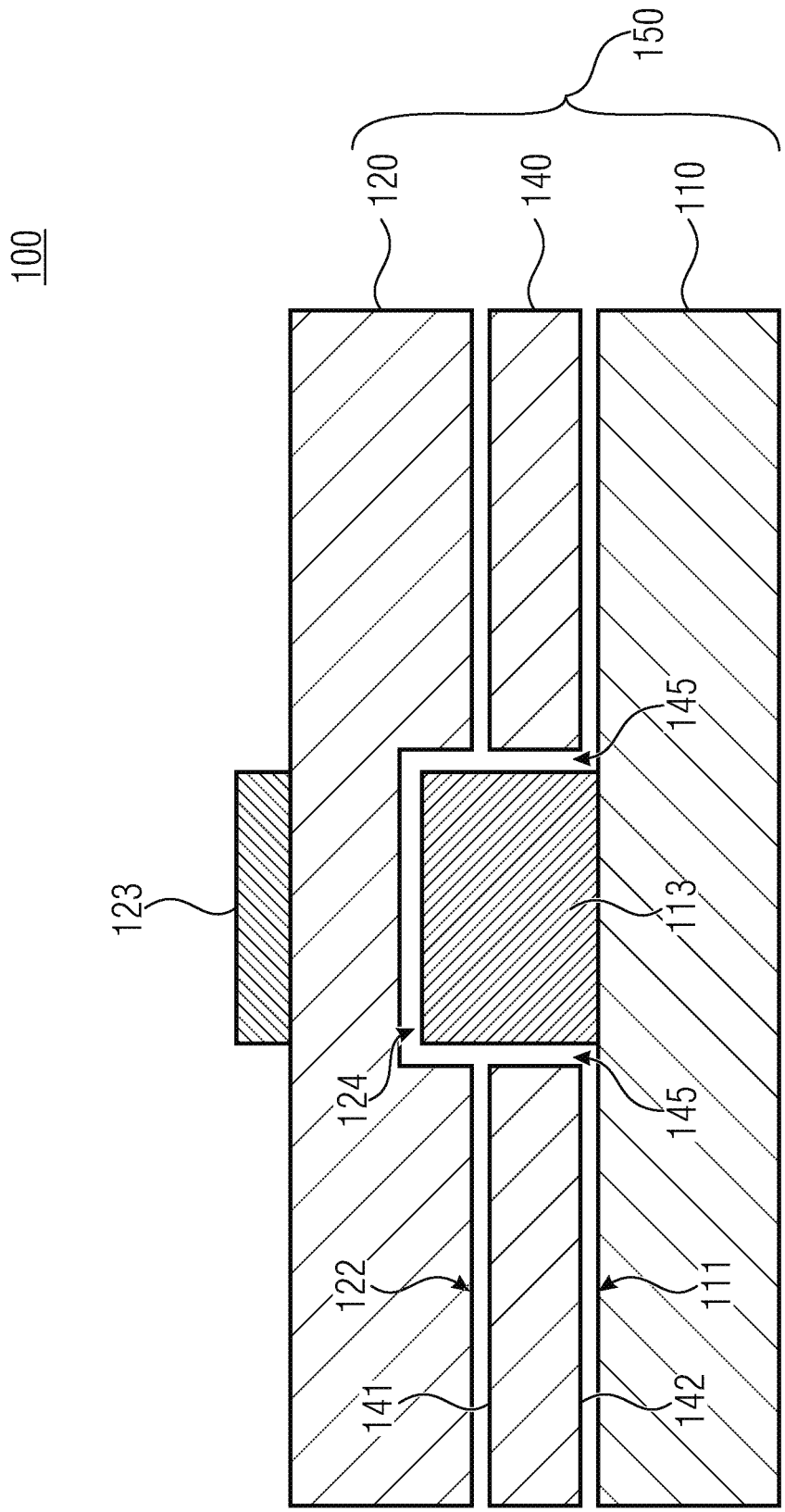
FIG. 7 shows a lateral sectional view of an inventive 3D foil package in accordance with an embodiment.

FIG. 7 shows another embodiment of a multi-layer 3D foil package 100. In this embodiment, an intermediate foil 140 is arranged between the first foil substrate 110 and the second foil substrate 120. The intermediate foil 140 comprises a first main surface region 141 and an opposite second main surface region 142. The first main surface region 141 of the intermediate foil 140 is arranged opposite the second main surface region 122 of the second foil substrate 120. The second main surface region 142 of the intermediate foil 140 is arranged opposite the first main surface region 111 of the first foil substrate 120.

A window opening 145 extends completely through the intermediate foil 140 between the first and the second main surface regions 141, 142. Within the foil substrate stack 150, the foil substrates 110, 120 and the intermediate foil 140 are arranged one above the other such that the continuous window opening 145 formed in the intermediate foil 140 is opposite and congruent to the cavity 124 formed in the second foil substrate 120. Thus, the functional electronic component 113 arranged on the first foil substrate 110 can be arranged within the window opening 145 formed in the intermediate foil 140 and, at the same time, within the cavity 124 formed in the second foil substrate 120.

Figure 8:
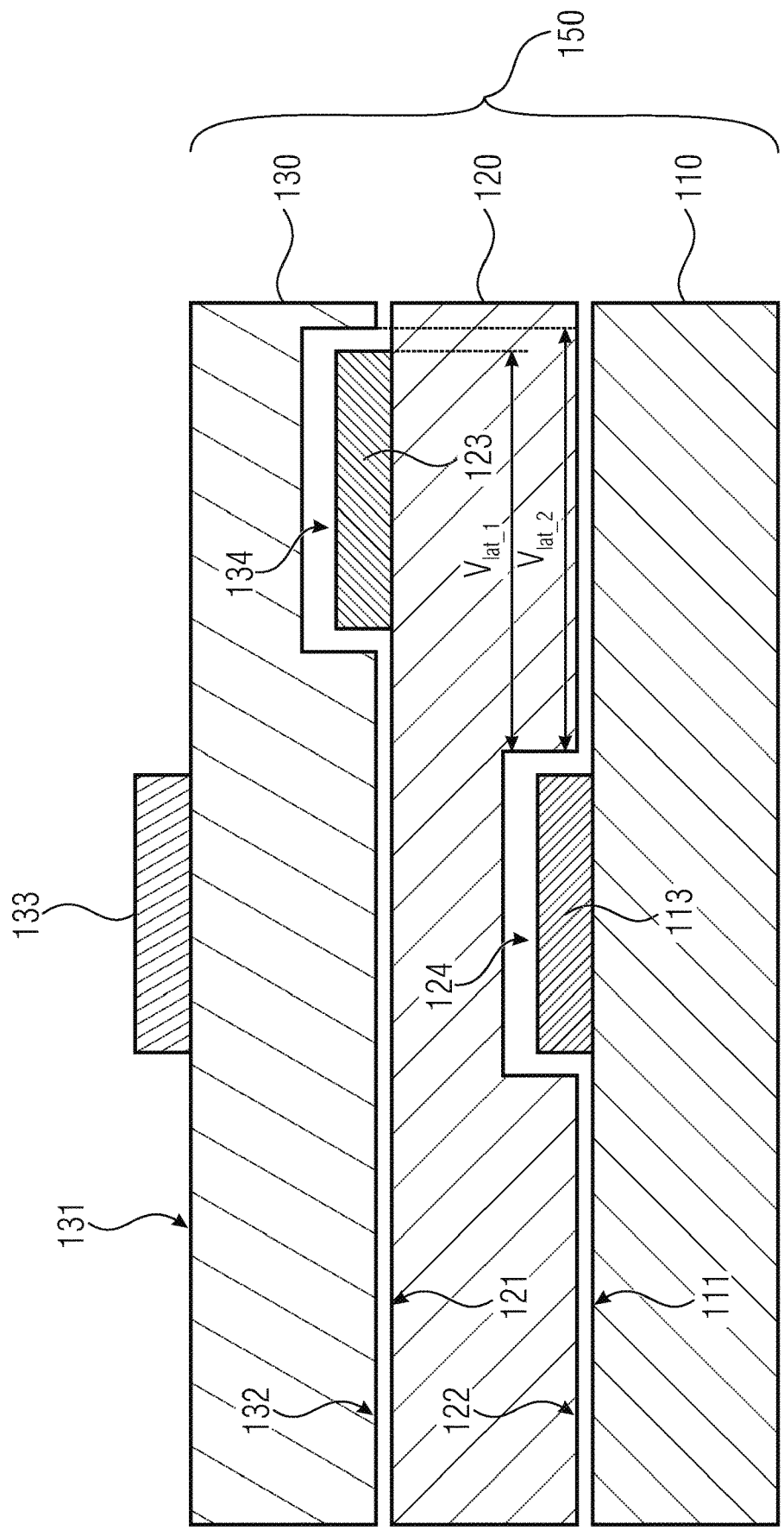
FIG. 8 shows a lateral sectional view of an inventive 3D foil package in accordance with an embodiment.

As mentioned above, the foil substrate stack 150 can comprise more than the exemplarily illustrated two foil substrates 110, 120. FIG. 8 shows an embodiment in which the foil substrate stack 150 comprises a third foil substrate 130. All the features discussed with relation to the two exemplarily mentioned foil substrates 110 and 120 also apply to the third foil substrate 130 illustrated exemplarily in FIG. 8, and further foil substrates maybe present in the foil substrate stack 150.

As can be recognized, the third foil substrate 130 can comprise a functional electronic component 133 on a first main surface region 131. The third foil substrate 130 can comprise a cavity 134 on an opposite second main surface region 132. This cavity 134 can be arranged opposite the functional electronic component 123 arranged on the first main surface region 121 of the second foil substrate 120. The functional electronic component 123 arranged on the first main surface region 121 of the second foil substrate 120 can, advantageously completely, be arranged within the cavity 134 arranged in the second main surface region 132 of the third foil substrate 130.

As can be seen, the cavity 124 formed in the second main surface region 122 of the second foil substrate 120 can comprise a lateral offset $V_{lat\_1}$ to the functional electronic component 123 arranged on the first main surface region 121 of the second foil substrate 120. This lateral offset $V_{lat\_1}$ is at least as large as the lateral extension or dimension of the electronic component 123 arranged on the first main surface region 121 of the second foil substrate 120, measured in the same direction. This means that the lateral offset $V_{lat\_1}$ is at least as large as the length or width of the electronic component 123. This ensures the electronic component 113 arranged on the first foil substrate 110 and the electronic component 123 arranged on the second foil substrate 120 to be spaced apart laterally from each other such that their external contours do not overlap in top view.

Alternatively or additionally, the cavity 124 formed in the second main surface region 122 of the second foil substrate 120 can comprise a lateral offset $V_{lat\_2}$ to the cavity 134 formed in the second main surface region 132 of the third foil substrate 130. This lateral offset $V_{lat\_2}$ is at least as large as the lateral dimension of the cavity 134 formed in the third foil substrate 130, measured in the same direction. This means that the lateral offset $V_{lat\_2}$ is at least as large as the length or width of the cavity 134 in the third foil substrate 130. This ensures the cavity 124 formed in the second foil substrate 120 and the cavity 134 formed in the third foil substrate 130 to be spaced apart laterally from each other such that their external contours do not overlap in top view.

Alternatively, the cavity 124 provided in the second main surface region 122 of the second foil substrate 120 can be arranged opposite the functional electronic component 123 arranged on the first main surface region 121 of the second foil substrate 120, as shown in the embodiments discussed before. Additionally, the cavity 124 provided in the second main surface region 122 of the second foil substrate 120 can be arranged opposite the cavity 134 arranged in the second main surface region 132 of the third foil substrate 130 (not illustrated explicitly here).

Irrespective of the number of foil substrates 110, 120, 130 arranged in the foil substrate stack 150, expressed completely generally, the respective functional electronic components 113, 123, 133 arranged on a first main surface region 111, 121, 132 of a respective foil substrate 110, 120, 130 can be arranged within the cavity 124, 134, formed in a second main surface region 112, 122, 132, of the respective oppositely arranged foil substrate 110, 120, 130.

Thus, the respective cavities 124, 134 and the respective electronic components 113, 123, 133 arranged therein can be arranged to be vertically opposite to one another (FIGS. 1, 2, 4-7, 9-10) or laterally offset to one another (FIG. 8).

This allows plane-parallel stacking of the individual foil substrates 110, 120, 130 within the foil substrate stack 150 one above the other. This reduces the overall structural height of an inventive 3D foil package 100 considerably when compared to conventional 3D packages.

One or more of the electrically insulating foil substrates 110, 120 arranged in the foil substrate stack 150 can exemplarily comprise a polymer or be made from a polymer. Alternatively, one or more foil substrates 110, 120 can comprise a polyimide or be made from a polyimide. Alternatively, one or more foil substrates 110, 120 can comprise glass or ceramics or be made from glass or ceramics. One or more of the foil substrates 110, 120 arranged in the foil substrate stack 150 can comprise at least one material selected from the group of polyimide, PET (polyethylene terephthalate), PEN (polyethylene naphthalate), FR4 (flame retardant) compounds, PEI (polyethylene imine) and LCP (Liquid Crystal Polymer).

Since the foil substrates 110, 120 are electrically insulating, electrically conducting patterns can be of advantage, for example to galvanically connect the functional electronic components 113, 123 arranged on the respective foil substrate 110, 120 among one another, and contact these among one another.

Figure 9:
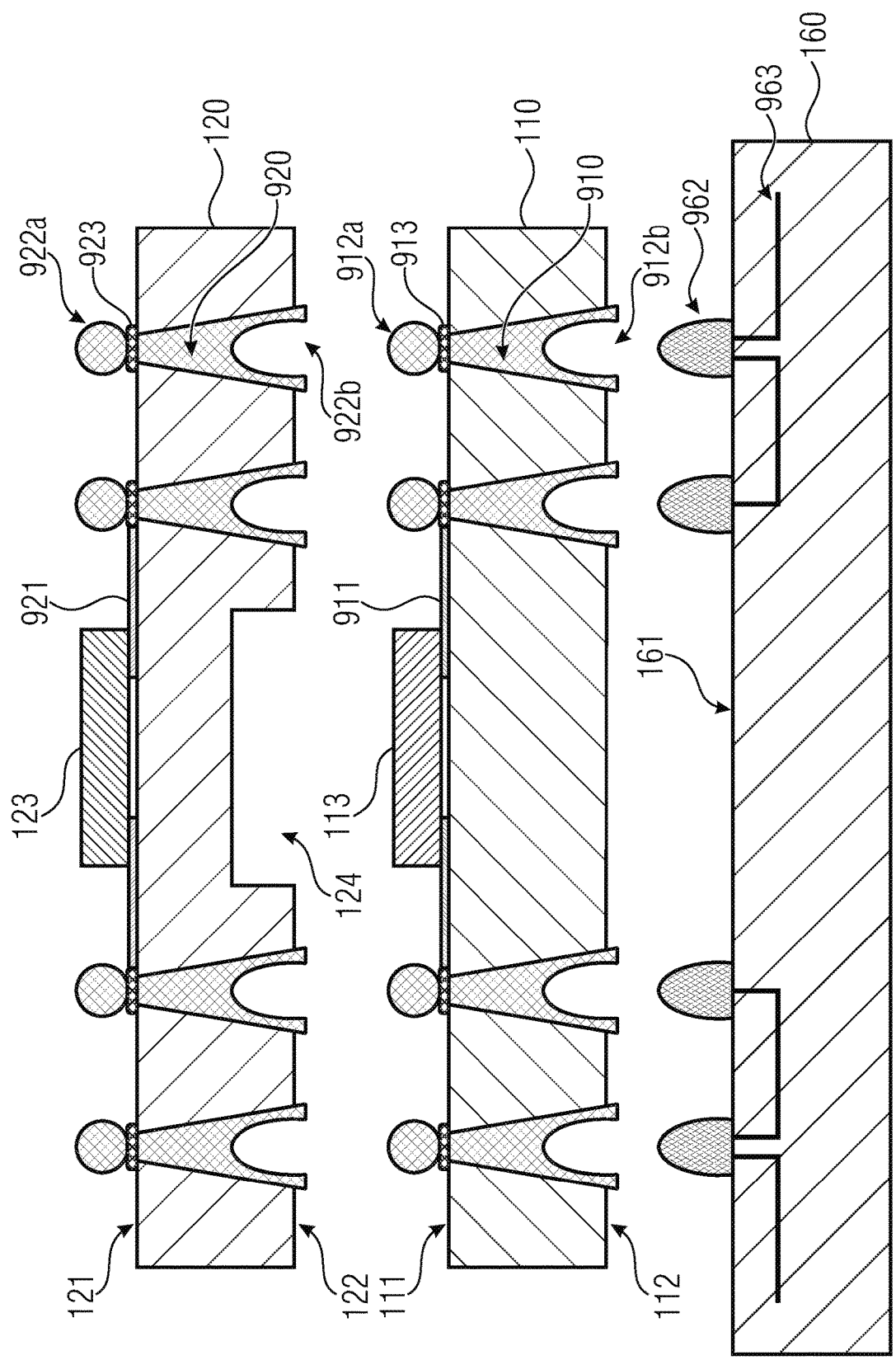
FIG. 9 shows a lateral sectional view of an inventive 3D foil package in accordance with an embodiment.

FIG. 9 shows an embodiment of a multi-layer 3D foil package 100 comprising such electrically conducting patterns 910, 911, 920, 921. In this embodiment, the second foil substrate 120 comprises at least one vertical through-connection or via 920 which extends throughout the second foil substrate 120 between the first main surface region 121 and the opposite second main surface region 122. In the example illustrated here, the second foil substrate 120 comprises a plurality of such vertical through-connections 920 extending vertically through the second foil substrate 120, which can also be referred to as vias.

Additionally, the second foil substrate 120 can comprise at least one conductive trace pattern 921. The conductive trace pattern 921 can extend laterally on the first main surface region 121 of the second foil substrate 120 between the functional electronic component 123 and the at least one through-connection 920 to galvanically connect the functional electronic component 123 to the through-connection 920.

The second foil substrate 120 can comprise one or more metalized regions (not illustrated explicitly here), like metallization sheets (for example Cu), for example, which dissipate heat from the electronic component 123 and distribute it over an area and, maybe, to the lateral outer edge regions of the foil substrate 120. Alternatively or additionally, the conductive trace pattern 921 can also provide such a functionality.

The first foil substrate 110 can comprise at least one vertical through-connection 910 which extends through the first foil substrate 110 between the first main surface region 111 and the opposite second main surface region 112. In the example illustrated here, the first foil substrate 110 can comprise a plurality of such vertical through-connections 910 extending vertically through the first foil substrate 110, which can also be referred to as vias.

Additionally, the first foil substrate 110 can comprise at least one conductive trace pattern 911. The conductive trace pattern 911 can extend laterally on the first main surface region 111 of the first foil substrate 110 between the functional electronic component 113 and the at least one through-connection 910 in order to galvanically connect the functional electronic component 113 to the through-connection 910.

The first foil substrate 110 can comprise one or more metalized regions (not illustrated here explicitly), like metallization sheets (for example Cu), for example, which dissipate heat from the electronic component 113 and distribute it over an area and, maybe, to the lateral outer edge regions of the foil substrate 110. Alternatively or additionally, the conductive trace pattern 911 can also provide such a functionality.

The vertical through-connection 920 of the second foil substrate 120 can galvanically contact the conductive trace pattern 911 arranged on the first main surface region 111 of the first foil substrate 110. Here, a galvanic connection can be made between the functional electronic component 113 arranged on the first foil substrate 110 and the functional electronic component 123 arranged on the second foil substrate 120.

This also applies to all the foil substrates arranged in an inventive 3D foil package 100, i.e. also to more than the purely exemplarily illustrated two foil substrates 110, 120. Thus, all the functional electronic components can be connected among one another vertically, in the sense of 3D system integration, by means of vertical through-connections in the respective foil substrate. Thus, the present innovative concept can also be referred to as 3D integration of two or more chip foil modules.

The vertical through-connections or vias 910, 920 can comprise a conductive material which can exemplarily be arranged within the respective via 910, 920 by means of sputtering metals (like Cu, Cr, TiW), by means of photoresist application, by means of exposing, by means of etching or by means of galvanic amplification.

As is also indicated exemplarily in FIG. 9, the respective through-connections 910, 920 can comprise form-fit elements 912a, 912b, 922a, 922b to improve a mechanical and, consequently, galvanic connection between the two through-connections 910, 920.

Exemplarily, the through-connection 910 provided in the first foil substrate 110 can comprise a first form-fit element 912a on the first main surface 111 of the first foil substrate 110. The through-connection 920 provided in the second foil substrate 120 in turn can comprise a complementary second form-fit element 922b on the opposite second main surface 122 of the second foil substrate 120. As can be seen exemplarily, the first form-fit element 912a of the through-connection 910 provided in the first foil substrate 110 can comprise a male shape and the second form-fit element 922b of the through-connection 920 provided in the second foil substrate 120 can comprise a complementary female shape. Thus, the form-fit elements 912a, 922b of the respective through-connections 910, 920 can engage in a form-fit manner between the two foil substrates 110, 120 to increase the mutual galvanic contact and mechanic stability of this connection. The form-fit elements 912a, 912b, 922a, 922b can be electrically conductive and exemplarily be implemented to be integral with the respective through-connection 910, 920.

The form-fit elements 912a, 912b, 921a, 922b and, in particular, the male form-fit elements 912a, 922a mentioned before, can be implemented for example as solder balls.

These solder balls 912a, 922a can exemplarily comprise a material from the group of Sn, Ag, Cu, Pb, Bi, In, Au, or alloys having at least two materials from the group of Sn, Ag, Cu, Pb, Bi, In or Au. The form-fit elements 912a, 922a implemented as solder balls thus serve, on the one hand, for bonding or mounting the two foil substrates 120, 130 by means of a form-fit and, consequently, accurately fit connection. On the other hand, the form-fit elements 912a, 922a implemented as solder balls additionally serve as a galvanic connection element between functional electronic components 113, 123.

The form-fit elements 912a, 922a implemented as solder balls can comprise a basically round geometrical shape. The respective complementary form-fit elements and, in particular, the female form-fit elements 912b, 922b mentioned before can comprise a complementary round geometrical shape. Thus, the complementary female form-fit elements 912b, 922b having a round geometrical shape can completely enclose the male form-fit elements 912a, 922a implemented as solder balls. It is also conceivable for the complementary female form-fit elements 912a, 922b, as is illustrated exemplarily in FIG. 9, to comprise a basically oval shape. In this case, the complementary female form-fit elements 912b, 922b having an oval geometrical shape can completely enclose the male form-fit elements 912a, 922a implemented as solder balls, including an optional metal pad 913, 923.

The 3D foil package 100 can optionally be arranged on a support substrate 160, for example on a compound board. The support substrate 160 can exemplarily be implemented as a PCB. Optionally, electrically conductive form-fit elements 962 can be provided on a main surface region 161 of the support substrate 160 facing the foil substrate stack 150 (in this case: the first foil substrate 110). These form-fit elements 962 can comprise a shape complementary to the form-fit elements 912b of the through-connections 910 in the first foil substrate 110. The form-fit elements 962 can exemplarily be implemented as solder balls and exemplarily comprise a material from the group of Sn, Ag, Cu, Pb, Bi, In, Au, or alloys having at least two materials from the group of Sn, Ag, Cu, Pb, Bi, In or Au. The form-fit elements 962 of the support substrate 162 can be connected galvanically to wiring 963 in the support substrate.

The foil substrate stack 150 arranged on the support substrate 160 can optionally be cast by a casting compound (not illustrated). The inventive multi-layer 3D foil package 100 can be produced in this way. The support substrate 160, however, is optional, i.e. the foil substrate stack 150 can also be cast by a casting compound (not illustrated), without the support substrate 160 being present, to realize an inventive multi-layer 3D foil package 100.

The through-connections 910, 920 provided in the foil substrates 110, 120 can comprise a conical cross-section. In the non-limiting example shown in FIG. 9, for example, the cross-section of a through-connection 910, 920 can taper from the second main surface region 112, 122 of the respective foil substrate 110, 120 towards the opposite first main surface region 111, 121 of the respective foil substrate 110, 120. However, it is also conceivable for the cross-section of a through-connection 910, 920 to taper from the first main surface region 111, 121 of the respective foil substrate 110, 120 towards the opposite second main surface region 112, 122 of the respective foil substrate 110, 120.

These conical cross-sections can exemplarily be generated by means of an ablation laser. Thus, lasing can be performed from one of the two main surfaces 112, 122 of the respective foil substrate 110, 120 towards the respective other opposite main surface 111, 121 of the respective foil substrate 110, 120. Advantageously, lasing terminates on a metal pad 913, 923 arranged on the corresponding opposite other main surface 111, 121 of the respective foil substrate 110, 120.

Only exemplarily, it has been described so far that the foil substrate stack 150 comprises at least two foil substrates 110, 120, wherein the second foil substrate 120 is arranged or stacked vertically on the first foil substrate 110 to form the foil substrate stack 150.

Figure 10:
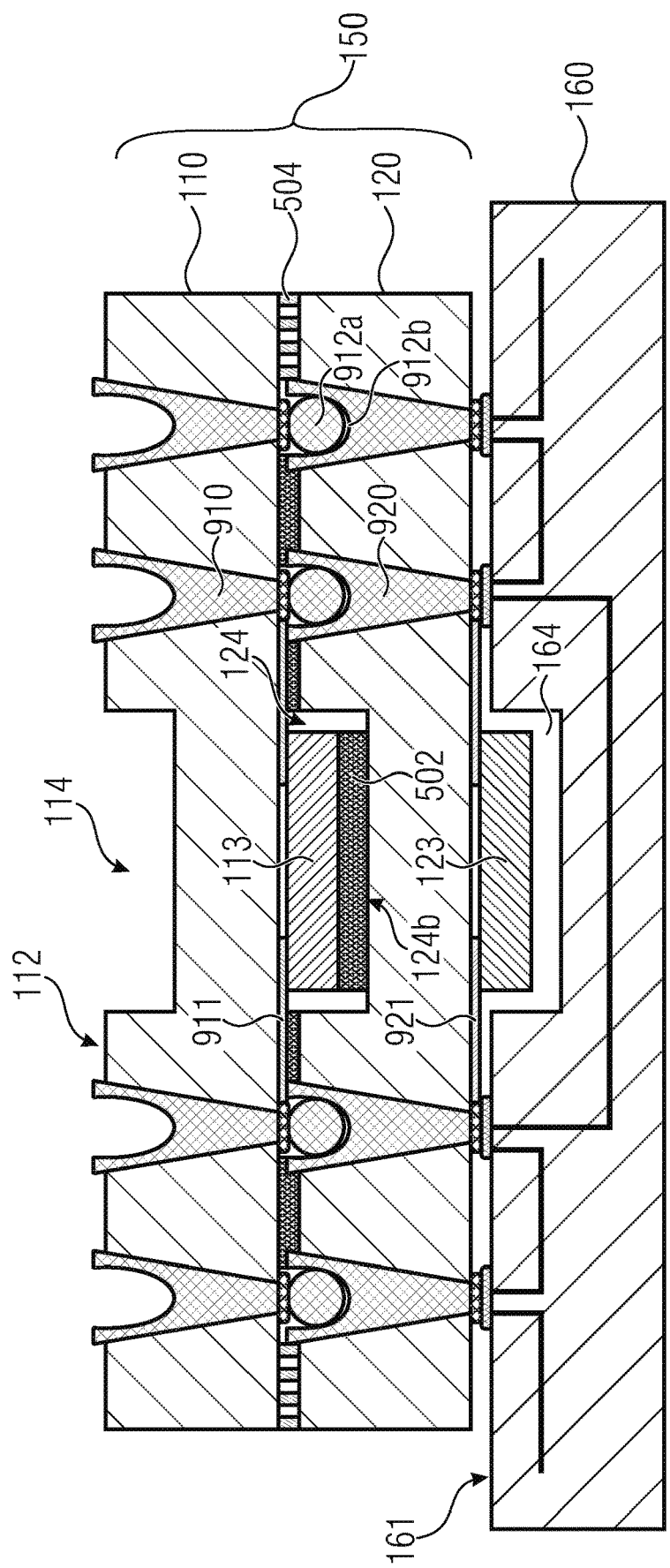
FIG. 10 shows a lateral sectional view of an inventive 3D foil package in accordance with an embodiment.

FIG. 10 shows an embodiment of a foil substrate stack 150 in which the foil substrates 110, 120 are arranged to be rotated by 180°. In this case, the second foil substrate 120 is arranged on the support substrate 160 and the first foil substrate 110 is arranged vertically above on the second foil substrate 120. The support substrate 160 can comprise a cavity 164 within which the functional electronic component 123 arranged on the second foil substrate 120 is placed, advantageously completely. In addition, it is shown how the form-fit elements 912a, 922b of the respective through-connections or vias 910, 920 engage in a form-fit manner. Otherwise, all the features discussed so far apply also to the embodiment shown in FIG. 10, which is why reference is made here to the description of the corresponding figures to avoid repetitions, wherein elements of equal function are provided with equal reference numerals.

In addition to the embodiments discussed so far, the first foil substrate 110 can also comprise, on its second main surface 112, a cavity 114 having at least one opening in the second main surface region 112. Thus, a third foil substrate (not shown here) can be arranged on the first foil substrate 110, more precisely on the second main surface region 112 of the first foil substrate 110. Thus, the third foil substrate can be arranged on the first foil substrate 110 such that a functional electronic component arranged on the third foil substrate is located within the cavity 114 formed in the first foil substrate 110, advantageously completely.

The cavities 114, 124, 134, 164 in the respective foil substrates 110, 120, 130 and in the support substrate 160 can exemplarily be produced by means of a subtractive method, for example by means of laser ablation, plasma etching or mechanical milling. The window openings 125, 145 mentioned in the foil layers 120a, 120b of the second foil substrate 120, or in the intermediate foil 140, can be produced by means of such subtractive methods. The window openings 125, 145 can additionally be produced by means of mechanical punching.

In accordance with an embodiment, the step of generating the cavity 124 in the second foil substrate 120 can be performed temporally before the step of arranging the functional electronic component 123 on the second foil substrate 120. In this case, the metallizations for conductive traces 911, 921 and vias 910, 920 can at first be patterned on the individual foil substrates 110, 120 and subsequently the electronic component 113, 123 (like a semiconductor chip, for example) can be flip-chip mounted and contacted. After that, the cavities 114, 124 can be produced on the opposite side of the same foil substrate 110, 120. This in turn can be performed by means of laser ablation, mechanical removal (like milling) or in a plasma process.

In accordance with an alternative embodiment, producing the cavities 114, 124 can be performed temporally before mounting the electronic component 113, 123 on the respective foil substrate 110, 120. In this case, the foil substrate 120 can exemplarily comprise two or more foil layers 120a, 120b, like two polymer foil layers (see FIG. 6). One of the two foil layers 120b can be provided with window openings 125 in a punching or laser cutting process. Laminating or gluing together the two foil layers 120a, 120b forms cavities 124, sealed on one side, at locations where one foil layer 120b before had the window opening 125. After preparing the foil substrate 120 with cavities 124, patterning conductive traces 921 and vias 920 on the opposite main surface region 121 of the respective foil substrate 120 can be performed. In this variation, it may be of advantage not to provide the cavities 124 directly below a location for chip mounting, but laterally offset, i.e. with a lateral offset $V_{lat\_1}$ (see FIG. 8). In this way, the flip-chip bond can be on a planar base. Laterally offsetting the position of the electronic component 113 relative to the opposite cavity 124 in the same foil substrate 120 is optional. A chip bond at a location with an underlying cavity is possible in principle (see, for example, FIG. 9).

In summary, this means that one of the basic concepts of the present invention is producing cavities 124 in an electrically insulating thin support substrate (foils, for example) 110, 120, advantageously such that the topography of an element 113 placed on a plane $E_1$ is embedded in the respective overlying or underlying substrate plane $E_2$ by stacking the different foil layers 110, 120. The result is an overall planar arrangement of several element layers one above the other.

In accordance with the present invention, a very thin electrically insulating material, like a polymer foil having a thickness of 20 μm to 200 μm, advantageously around 50 μm, can be used as the substrate for placing and contacting the electronic component 113. Alternatively, a thin, non-polymer foil, like thin glass or ceramics, can be used.

Thus, the invention relates to, among other things, a method for manufacturing a 3D foil package 100 as described herein, for example by stacking foil substrates 110, 120 one above the other to form a multi-layer 3D foil package, wherein:
  at least one electrically insulating foil substrate 110, 120 having a thickness of 20 μm to 500 μm, advantageously below 100 μm, can be present in each foil plane $E_1$, $E_2$,
  each foil plane $E_1$, $E_2$ can comprise a single-layer or multi-layer structure of conductive trace paths 911, 921 at the top or bottom,
  each foil plane $E_1$, $E_2$ can comprise electrically functional components 113, 123 which are partly connected via the conductive trace paths 911, 921,
  the functional components 113, 123 are placed on an outer surface of a foil plane $E_1$, $E_2$ (i.e. at first topographically protruding),
  the individual foil planes $E_1$, $E_2$ comprise electrical through-connections 910, 920 from the front to the back thereof, and
  the through-connections 910, 920 can optionally also be in electrical contact to the functional components 113, 123.

Advantageously, the element volume of the electrical components 113, 123 on a foil plane $E_1$, $E_2$ can be embedded in the respective overlying or underlying foil substrate 110, 120 in correspondingly prepared recesses or cavities 124 by the process of stacking. Optionally, contact areas at the top and bottom of the individual foil planes $E_1$, $E_2$ can be connected among one another electrically and mechanically in a predeterminable manner.

Consequently, an embodiment can provide a method for connecting electrical components 113, 123, comprising the steps of:
  providing a substrate 160 having at least a first contact element 962
  providing at least two non-conducting substrates 110, 120 having each at least one electrically functional element 113, 123
  producing a cavity 124 in at least one of the non-conducting substrates 120, wherein the cavity 124 is implemented such that an electrically functional element 113 of another substrate 110 can be lowered into this cavity 124 in a largely form-fit manner
  producing at least one electrically conductive channel 910, 920 each through the at least two non-conducting substrates 110, 120, wherein each electrically conductive channel 910, 920 comprises a first form-fit element and a complementary second form-fit element (like contact element 912a, 922a and a cavity 912b, 922b) each
  producing at least one electrically conducting connection 911, 921 each between an electrically conductive channel 910, 920 and at least one electrically functional element 113, 123
  producing an electrically conducting connection between the substrate 160 and the at least two non-conducting substrates 110, 120 by adjustingly joining at least one contact element 962 with at least one cavity 912b.

Another embodiment can provide for a stack 150 of electrical components 113, 123, comprising:
  a substrate 160 having at least one first contact element 962;
  two non-conducting substrates 110, 120 having at least one electrically functional element 113, 123 each, wherein the electrically functional elements 113, 123 are each embedded in a cavity 124 of the overlying non-conducting substrate 120 such that the result is a planar compound of the substrates 110, 120;
  at least one electrically conductive channel 910, 920 each through the at least two non-conducting substrates 110, 120, wherein each electrically conductive channel 910, 920 comprises one contact element 912a, 922a and a cavity 912b, 922b each;
  at least one electrically conducting connection 911, 921 each between an electrically conductive channel 910, 920 and at least one electrically functional element 113, 123; and
  an electrically conducting connection 962 between the substrate 160 and the at least two non-conducting substrates 110, 120 by an electrically conductive contact between at least one contact element 962 and at least one cavity 912b.

When compared to conventional 3D packages, the present invention particularly exhibits the following advantages:

The topography of the functional electronic components (like chip) 113 when mounting is compensated by forming a correspondingly dimensioned cavity 124 in the overlying or underlying foil layer; in this way, several chip foil modules (foil substrates) 110, 120 can be stacked one above the other in a plane-parallel manner. The parallelism in the layer structure is highly advantageous for a multi-layer and adjusted stacking of the foil modules 110, 120.

The flexibility of the foil substrates 110, 120 makes compensating local differences in height when connecting the individual foil substrates 110, 120 easier; in comparison, rigid substrates (like PCB boards, silicon or glass wafers, for example) can only be connected securely in the case of perfect planarity of the bond plane.

Laser ablation in polymer foils produces vias 910, 920 having small diameters (30 μm to 100 μm); vias 910, 920 in foil substrates 110, 120 can be realized such that a conical cross-section is obtained; the funnel-shaped opening allows (after metallizing the via flanks) solder wetting within the vias 910, 920 and thus enables a largely planar electrical contact. The amount of solder does not have to be controlled in an extremely precise manner.

Polymer foil substrates as supports for IC components 113, 123 offer big advantages:
- self-insulating, thus easier TSV technology
- cheap material, i.e. larger area demand is not a cost factor suitable for roll-to-roll processes
- sheet-to-sheet stacking produces many cheap packages in a single process step Embedding very thin and, thus, frail semiconductor elements 113, 123 results in a considerable mechanical stabilization. Thus, a chip foil module 110, 120 can be processed much quicker and in a more robust manner. Semiconductor elements (like ICs, for example) can have different sizes (area, height, material).

A foil substrate stack 150 based on a PCB can be processed using conventional package technologies, like a conventional thick IC.

The present invention can further be realized in the form of the following further embodiments which can be combined as desired with the embodiments described herein:

1. A multi-layer 3D foil package (100) comprising:
    a foil substrate stack (150) having at least two foil planes ($E_1$, $E_2$), wherein a first electrically insulating foil substrate (110) is arranged in a first foil plane ($E_1$), and wherein a second electrically insulating foil substrate (120) is arranged in a second foil plane ($E_2$),
    wherein the first foil substrate (110) comprises a first main surface region (111) on which at least one functional electronic component (113) is arranged,
    wherein the second foil substrate (120) comprises a first main surface region (121) and an oppositely arranged second main surface region (122), wherein at least one functional electronic component (123) is arranged on the first main surface region (121), and wherein the second foil substrate (120) comprises a cavity (124) having at least one opening in the second main surface region (122),
    wherein the foil substrates (110, 120) are arranged one above the other within the foil substrate stack (150) such that the first main surface region (111) of the first foil substrate (110) is opposite the second main surface region (122) of the second foil substrate (120) and the functional electronic component (113) arranged on the first foil substrate (110) is arranged within the cavity (124) provided in the second foil substrate (120).

2. The multi-layer 3D foil package (100) in accordance with embodiment 1,
    wherein the functional electronic component (113) arranged on the first main surface region (111) of the first foil substrate (110) comprises a portion having a topographic protrusion ($H_{113}$) which protrudes topographically beyond the first main surface region (111) of the first foil substrate (110), and
    wherein the cavity (124) provided in the second foil substrate (120) comprises a volume which is greater than the volume of the portion of the functional electronic component (113) arranged on the first foil substrate (110), which protrudes topographically beyond the first main surface region (111) of the first foil substrate (110).

3. The multi-layer 3D foil package (100) in accordance with embodiment 2,
    wherein the functional electronic component (113) arranged on the first main surface region (111) of the first foil substrate (110) comprises a topographic protrusion ($H_{113}$) between 10 μm and 100 μm, or between 20 μm and 80 μm, and wherein the cavity (124) provided in the second foil substrate (120) comprises a depth ($H_{124}$) which is greater by 1 μm to 50 μm, or by 1 μm to 30 μm, than the topographic protrusion ($H_{113}$) of the functional electronic component (113) arranged on the first foil substrate (110).

4. The multi-layer 3D foil package (100) in accordance with any of embodiments 1 to 3,
    wherein the functional electronic component (113) arranged on the first main surface region (111) of the first foil substrate (110) is arranged laterally completely within the cavity (124) provided in the second foil substrate (120).

5. The multi-layer 3D foil package (100) in accordance with any of embodiments 1 to 4,
    wherein a polymer (502) which fills at least in portions a void (501) between an external contour of the functional electronic component (113) and a wall (124a, 124b) of the cavity (124) opposite this external contour is present between the functional electronic component (113) and the cavity (124).

6. The multi-layer 3D foil package (100) in accordance with any of embodiments 1 to 5,
    wherein the cavity (124) provided in the second main surface region (122) of the second foil substrate (120) is arranged opposite the functional electronic component (123) arranged on the first main surface region (121) of the second foil substrate (120), or
    wherein the cavity (124) formed in the second main surface region (122) of the second foil substrate (120) comprises a lateral offset ($V_{lat\_1}$) to the functional electronic component (123) arranged on the first main surface region (121) of the second foil substrate (120).

7. The multi-layer 3D foil package (100) in accordance with any of embodiments 1 to 6,
    wherein the second foil substrate (120) comprises at least two foil substrate layers (120a, 120b) arranged one above the other, wherein one of the two foil substrate layers (120b) comprises a continuous window opening (125) so that the window opening (125) in the one foil substrate layer (120b) forms the cavity (124) in the second foil substrate (120) together with the window opening-less one of the respective other foil substrate layer (120a) when the two foil substrate layers (120) are arranged one above the other.

8. The multi-layer 3D foil package (100) in accordance with any of embodiments 1 to 6,
    wherein an intermediate foil (140) is arranged between the first foil substrate (110) and the second foil substrate (120), wherein the intermediate foil (140) comprises a first main surface region (141) and an opposite second main surface region (142), and wherein the intermediate foil (140) comprises a window opening (145) extending completely through the intermediate foil (140) between the first and second main surface regions (141, 142),
    wherein the foil substrates (110, 120) and the intermediate foil (140) within the foil substrate stack (150) are arranged one above the other such that the continuous window opening (145) formed in the intermediate foil (140) is opposite the cavity (124) formed in the second foil substrate (120) and the functional electronic component (113) arranged on the first foil substrate (110) is arranged within the window opening formed in the intermediate foil (140) and within the cavity (124) formed in the second foil substrate (120).

9. The multi-layer 3D foil package in accordance with any of embodiments 1 to 8,
    wherein the foil substrates (110, 120) arranged in the foil substrate stack (150) are stacked one above the other in a plane-parallel manner.

10. The multi-layer 3D foil package (100) in accordance with any of embodiments 1 to 9,
    wherein the second foil substrate (120) comprises at least one vertical through-connection (920) which extends through the second foil substrate (120) between the first main surface region (121) and the opposite second main surface region (122), and
    wherein the second foil substrate (120) additionally comprises at least one conductive trace pattern (921) which extends laterally on the first main surface region (121) of the second foil substrate (120) between the functional electronic component (123) and the at least one through-connection (920) and connects the functional electronic component (123) galvanically to the through-connection (920).

11. The multi-layer 3D foil package (100) in accordance with embodiment 10,
    wherein the first foil substrate (110) comprises at least one conductive trace pattern (911) which extends laterally on the first main surface region (111) of the first foil substrate (110) and galvanically contacts the functional electronic component (113) arranged on the first main surface region (111) of the first foil substrate (110), and
    wherein the vertical through-connection (920) in the second foil substrate (120) galvanically contacts the conductive trace pattern (911) arranged on the first main surface region (111) of the first foil substrate (110) to produce a galvanic connection between the functional electronic component (113) arranged on the first foil substrate (110) and the functional electronic component (123) arranged on the second foil substrate (120).

12. The multi-layer 3D foil package (100) in accordance with embodiment 10 or 11,
    wherein the first foil substrate (110) comprises at least one vertical through-connection (910) extending through the first foil substrate (110) between the first main surface region (111) and the opposite second main surface region (112),
    wherein the vertical through-connection (910) in the first foil substrate (110) galvanically contacts the vertical through-connection (920) in the second foil substrate (120), and
    wherein the vertical through-connection (910) in the first foil substrate (110) comprises a first form-fit element (912*a*), and wherein the vertical through-connection (920) in the second foil substrate (120) comprises a second form-fit element (922*b*) complementary to the first form-fit element (912*a*), wherein the two form-fit elements (912*a*, 922*b*) are configured to engage in a form-fit manner between the first and second foil substrates (110, 120).

13. The multi-layer 3D foil package in accordance with any of embodiments 1 to 12,
    wherein the first foil substrate comprises at least one vertical through-connection having a conical cross-section, and/or
    wherein the second foil substrate comprises at least one vertical through-connection having a conical cross-section.

14. The multi-layer 3D foil package in accordance with any of embodiments 1 to 13,
    wherein the foil substrate stack comprises at least a third foil plane in which a third electrically insulating foil substrate having a functional electronic component arranged on a first main surface region is arranged, and
    wherein the foil substrates of the first, second and third foil planes are galvanically connected among one another by means of one or more vertical through-connections provided in the respective foil plane.

15. The multi-layer 3D foil package (100) in accordance with any of embodiments 1 to 14,
    wherein the foil substrates (110, 120) arranged in the foil substrate stack (150) each comprise a layer thickness between 20 μm and 500 μm and advantageously between 20 μm and 100 μm.

16. The multi-layer 3D foil package (100) in accordance with any of embodiments 1 to 15,
    wherein at least one of the foil substrates (110, 120) arranged in the foil substrate stack (150) is implemented as a polymer foil.

17. The multi-layer 3D foil package (100) in accordance with any of embodiments 1 to 16,
    wherein the functional electronic components (113, 123) are each applied on the respective foil substrate (110, 120) by means of a conductive adhesive (503) or in flip-chip bonding technology by means of solder connections and underfill material.

18. The multi-layer 3D foil package (100) in accordance with any of embodiments 1 to 17,
    wherein the foil substrates (110, 120) arranged in the foil substrate stack (150) are connected among one another by means of a solderable alloy, by means of conductive adhesive or by means of a thermo-compression-bonded metal connection.

19. A method for manufacturing a multi-layer 3D foil package (100), the method comprising:
    providing (301) a first electrically insulating foil substrate (110) and a second electrically insulating foil substrate (120),
    arranging (302) at least one functional electronic component (113) on a first main surface region (111) of the first foil substrate (110), arranging (303) at least one functional electronic component (123) on a first main surface region (122) of the second foil substrate (120),
    producing a cavity (124) in the second foil substrate (120) such that this cavity (124) comprises at least one opening in a second main surface region (121) opposite the first main surface region (121) of the second foil substrate (120), and
    forming a foil substrate stack (150) by arranging the first and second foil substrates (110, 120) vertically above each other, wherein the foil substrates (110, 120) are arranged one above the other such that the first main surface region (111) of the first foil substrate (110) is opposite the second main surface region (122) of the second foil substrate (120) and the functional electronic component (113) arranged on the first foil substrate (110) is arranged within the cavity (124) provided in the second foil substrate (120).

20. The method in accordance with embodiment 19,
    wherein the step of producing the cavity (124) comprises removing substrate material in the second foil substrate (120) by means of a subtractive method, for example by means of laser ablation, plasma etching or mechanical milling.

21. The method in accordance with embodiment 19,
    wherein the step of producing the cavity (124) in the second foil substrate (120) comprises providing a first foil substrate layer (120a) and a second foil substrate layer (120b),
    wherein a window opening (125) is introduced into one of the two foil substrate layers (120b) and subsequently both foil substrate layers (120a, 120b) are connected to each other to form the second foil substrate (120),
    wherein the window opening (125) in the one foil substrate layer (120b), together with the window opening-less other foil substrate layer (120a) forms the cavity (124) in the second foil substrate (120) when the two foil substrate layers (120a, 120b) are arranged one above the other.

22. The method in accordance with any of embodiments 19 to 21,
    wherein a polymer (502) is introduced between the functional electronic component (113) and the cavity (124) to fill at least in portions a void (501) between an external contour of the functional electronic component (113) and a wall (124a, 124b) of the cavity (124) opposite the external contour.

23. The method in accordance with any of embodiments 19 to 22,
    wherein the foil substrates (110, 120) arranged in the foil substrate stack (150) are connected to one another in a negative pressure environment.

24. The method in accordance with any of embodiments 19 to 23,
    wherein the step of producing the cavity (124) in the second foil substrate (120) is performed temporally before the step of arranging the functional electronic component (123) on the second foil substrate (120).

25. The method in accordance with any of embodiments 19 to 23,
    wherein the step of arranging the functional electronic component (123) on the second foil substrate (120) comprises patterning one or more metallization layers (921) on the first main surface (121) of the second foil substrate (120) and mounting the functional electronic component (123) on the one or more patterned metallization layers (921) in flip-chip technology, and
    wherein the step of producing the cavity (124) in the second foil substrate (120) is performed temporally after the step of arranging the functional electronic component (123) on the second foil substrate (120).

26. The method in accordance with any of embodiments 19 to 25,
    wherein the step of producing the cavity (124) comprises producing the cavity (124) in the second main surface region (122) of the second foil substrate (120) such that it has a lateral offset ($V_{lat\_1}$) relative to the functional electronic component (123) arranged on the opposite first main surface region (121) of the second foil substrate (120).

27. The method in accordance with any of embodiments 19 to 26, the method further comprising:
    manufacturing at least one vertical through-connection (910) having a conical cross-section in the first foil substrate (110), and/or
    manufacturing at least one vertical through-connection (920) having a conical cross-section in the second foil substrate (120).

28. The method in accordance with embodiment 27,
    wherein manufacturing the vertical through-connections (910, 920) having a conical cross-section is performed by means of an ablation laser,
    wherein lasing is performed from one of the two main surfaces (112, 122) of the respective foil substrate (110, 120) to the respective other opposite main surface (111, 121) of the respective foil substrate (110, 120), and
    wherein lasing terminates on a metal pad (913, 923) which is arranged on the corresponding opposite other main surface (111, 121) of the respective foil substrate (110, 120).

29. The method in accordance with any of embodiments 19 to 28, the method further comprising:
    producing at least one vertical through-connection (920) in the second foil substrate (120) such that the vertical through-connection (920) extends through the second foil substrate (120) between the first main surface region (121) and the opposite second main surface region (122), and
    contacting the vertical through-connection (920) by a conductive trace pattern (921), arranged on the first main surface region (121) of the second foil substrate (120), which extends laterally between the functional electronic component (123) and the vertical through-connection (920) to galvanically connect the functional electronic component (123) to the vertical through-connection (920).

30. The method in accordance with embodiment 29, the method further comprising:
    contacting the vertical through-connection (920) in the second foil substrate (920) by a conductive trace pattern (911), arranged on the first main surface region (111) of the first foil substrate (110), which galvanically contacts the functional electronic component (113) arranged on the first main surface region (111) of the first foil substrate (110) to produce a galvanic connection between the functional electronic component (113) arranged on the first foil substrate (110) and the functional electronic component (123) arranged on the second foil substrate (120) by means of the vertical through-connection (920).

31. The method in accordance with any of embodiments 19 to 30, the method further comprising:
    providing a foil (140) having a first main surface region (141) and an oppositely arranged second main surface region (142),
    producing a window opening (145) in the foil (140) so that the window opening (145) extends completely through the foil (140) between the first and second main surface regions (141, 142),
    arranging the foil (140) between the first foil substrate (110) and the second foil substrate (120) such that the window opening (145) implemented to be continuous in the foil (140) is opposite the cavity (124) formed in the second foil substrate (120) and the functional electronic component (113) arranged on the first foil substrate (110) is arranged within the window opening formed in the foil (140) and within the cavity (124) formed in the second foil substrate (120).

32. The method in accordance with any of embodiments 19 to 31, the method further comprising:
    arranging a plurality of functional electronic components (113) on the first main surface region (111) of the first foil substrate (110), arranging a plurality of functional electronic components (123) on the first main surface region (121) of the second foil substrate (120), producing a plurality of cavities (124) in the second main surface region (122) of the second foil substrate (120), opposite the first main surface region (121) of the second foil substrate (120), producing a plurality of foil substrate stacks (150) by arranging the first and second foil substrates (110, 120) vertically one above the other, wherein the foil substrates (110, 120) are arranged one above the other such that the first main surface region (111) of the first foil substrate (110) is opposite the second main surface region (122) of the second foil substrate (120) and the plurality of functional electronic components (113) arranged on the first foil substrate (110) are arranged within the plurality of cavities (124) provided in the second foil substrate (120), and subsequently dicing the plurality of foil substrate stacks (150) produced in this way to obtain a plurality of multi-layer 3D foil packages (100).

Although some aspects were described in connection with an apparatus, it is to be understood that these aspects also represent a description of the corresponding method so that a block or element of an apparatus is to be understood to be also a corresponding method step or feature of a method step. In analogy, aspects having been described in connection with or as a method step also represent a description of a corresponding block or detail or feature of a corresponding apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A multi-layer 3D foil package comprising:
a foil substrate stack comprising at least two foil planes, wherein a first electrically insulating and flexible foil substrate is arranged in a first foil plane, and wherein a second electrically insulating and flexible foil substrate is arranged in a second foil plane,
wherein the first foil substrate comprises a first main surface region on which at least one functional electronic component is arranged,
wherein the second foil substrate comprises a first main surface region and an oppositely arranged second main surface region, wherein at least one functional electronic component is arranged on the first main surface region, and wherein the second foil substrate comprises a cavity comprising at least one opening in the second main surface region,
wherein the foil substrates are arranged one above the other within the foil substrate stack such that the first main surface region of the first foil substrate is opposite the second main surface region of the second foil substrate and the functional electronic component arranged on the first foil substrate is arranged laterally completely within the cavity provided in the second foil substrate.

2. The multi-layer 3D foil package in accordance with claim 1,
wherein the functional electronic component arranged on the first main surface region of the first foil substrate comprises a portion comprising a topographic protrusion which protrudes topographically beyond the first main surface region of the first foil substrate, and
wherein the cavity provided in the second foil substrate comprises a volume which is greater than the volume of the portion of the functional electronic component arranged on the first foil substrate, which protrudes topographically beyond the first main surface region of the first foil substrate.

3. The multi-layer 3D foil package in accordance with claim 1,
wherein a polymer which fills at least in portions a void between an external contour of the functional electronic component and a wall of the cavity opposite this external contour is present between the functional electronic component and the cavity.

4. The multi-layer 3D foil package in accordance with claim 1,
wherein the cavity provided in the second main surface region of the second foil substrate is arranged opposite the functional electronic component arranged on the first main surface region of the second foil substrate, or
wherein the cavity formed in the second main surface region of the second foil substrate comprises a lateral offset to the functional electronic component arranged on the first main surface region of the second foil substrate,
wherein this lateral offset is at least as large as the lateral extension of the functional electronic component arranged on the second foil substrate, measured in the same direction.

5. The multi-layer 3D foil package in accordance with claim 1,
wherein the second foil substrate comprises at least two foil substrate layers arranged one above the other, wherein one of the two foil substrate layers comprises a continuous window opening, and wherein the other one of the two substrate layers comprises a recess,
wherein the window opening in the one foil substrate layer forms the cavity in the second foil substrate together with the recess in the respective other foil substrate layer when the two foil substrate layers are arranged one above the other.

6. The multi-layer 3D foil package in accordance with claim 1,
wherein the second foil substrate comprises at least one vertical through-connection which extends through the second foil substrate between the first main surface region and the opposite second main surface region,
wherein the second foil substrate additionally comprises at least one conductive trace pattern which extends laterally on the first main surface region of the second foil substrate between the functional electronic component and the at least one through-connection and connects the functional electronic component galvanically to the through-connection,
wherein the first foil substrate comprises at least one conductive trace pattern which extends laterally on the first main surface region of the first foil substrate and galvanically contacts the functional electronic component arranged on the first main surface region of the first foil substrate, and wherein the vertical through-connection in the second foil substrate galvanically contacts the conductive trace pattern arranged on the first main surface region of the first foil substrate to produce a galvanic connection between the functional electronic component arranged on the first foil substrate and the functional electronic component arranged on the second foil substrate.

7. The multi-layer 3D foil package in accordance with claim 6,
wherein the first foil substrate comprises at least one vertical through-connection extending through the first foil substrate between the first main surface region and the opposite second main surface region,
wherein the vertical through-connection in the first foil substrate galvanically contacts the vertical through-connection in the second foil substrate, and
wherein the vertical through-connection in the first foil substrate comprises a first form-fit element, and wherein the vertical through-connection in the second foil substrate comprises a second form-fit element complementary to the first form-fit element, wherein the two form-fit elements are configured to engage in a form-fit manner between the first and second foil substrates.

8. The multi-layer 3D foil package in accordance with claim 1,
wherein the foil substrate stack comprises at least a third foil plane in which a third electrically insulating foil substrate comprising a functional electronic component arranged on a first main surface region is arranged, and
wherein the foil substrates of the first, second and third foil planes are galvanically connected among one another by means of one or more vertical through-connections provided in the respective foil plane.

9. The multi-layer 3D foil package in accordance with claim 1,
wherein the second foil substrate is implemented in the form of a single-layered foil, wherein the cavity is implemented in the single-layered foil, or
wherein the second foil substrate comprises a first and a second foil substrate layer, wherein one of the two foil substrate layers comprises a continuous window opening and the respective other one of the two foil substrate layers comprises a recess, wherein the window opening and the recess together form the cavity.

10. The multi-layer 3D foil package in accordance with claim 1,
wherein both the first foil substrate and the second foil substrate are implemented as a single-layered foil.

11. The multi-layer 3D foil package in accordance with claim 1,
wherein the cavity comprises at least four lateral side walls which basically extend perpendicularly to the first and second main surface regions of the second foil substrate, and
wherein the dimensions of the cavity in the second foil substrate are as large as, or slightly larger than, the dimensions of the at least one functional electronic component on the opposite first foil substrate, such that the at least one functional electronic component is surrounded by said at least four lateral side walls and thereby completely accommodated inside the cavity.

12. A method for manufacturing a multi-layer 3D foil package, the method comprising:
providing a first electrically insulating and flexible foil substrate and a second electrically insulating and flexible foil substrate,
arranging at least one functional electronic component on a first main surface region of the first foil substrate,
arranging at least one functional electronic component on a first main surface region of the second foil substrate,
producing a cavity in the second foil substrate such that this cavity comprises at least one opening in a second main surface region opposite the first main surface region of the second foil substrate, and
forming a foil substrate stack by arranging the first and second foil substrates vertically above each other, wherein the foil substrates are arranged one above the other such that the first main surface region of the first foil substrate is opposite the second main surface region of the second foil substrate and such that the functional electronic component arranged on the first foil substrate is arranged laterally completely within the cavity provided in the second foil substrate.

13. The method in accordance with claim 12,
wherein producing the cavity in the second foil substrate comprises providing a first foil substrate layer and a second foil substrate layer,
wherein a window opening extending completely through the respective foil substrate layer is introduced into one of the two foil substrate layers and a recess not extending completely through the foil substrate layer is introduced into the respective other foil substrate layer, and wherein subsequently both foil substrate layers are connected to each other to form the second foil substrate,
wherein the window opening in the one foil substrate layer, together with the recess of the respective other foil substrate layer form the cavity in the second foil substrate when the two foil substrate layers are arranged one above the other.

14. The method in accordance with claim 12,
wherein a polymer is introduced between the functional electronic component and the cavity to fill at least in portions a void between an external contour of the functional electronic component and a wall of the cavity opposite the external contour.

15. The method in accordance with claim 12,
wherein producing the cavity comprises producing the cavity in the second main surface region of the second foil substrate such that it comprises a lateral offset relative to the functional electronic component arranged on the opposite first main surface region of the second foil substrate,
wherein this lateral offset is at least as large as the lateral extension of the functional electronic component arranged on the second foil substrate, measured in the same direction.

16. The method in accordance with claim 12, the method further comprising:
manufacturing at least one vertical through-connection comprising a conical cross-section in the first foil substrate, and/or
manufacturing at least one vertical through-connection comprising a conical cross-section in the second foil substrate,
wherein manufacturing the vertical through-connections comprising a conical cross-section is performed by means of an ablation laser,
wherein lasing is performed from one of the two main surfaces of the respective foil substrate to the respective other opposite main surface of the respective foil substrate, and wherein lasing terminates on a metal pad which is arranged on the corresponding opposite other main surface of the respective foil substrate.

17. A multi-layer 3D foil package comprising:
a foil substrate stack comprising at least two foil planes, wherein a first electrically insulating foil substrate is arranged in a first foil plane, and wherein a second electrically insulating foil substrate is arranged in a second foil plane,
wherein the first foil substrate comprises a first main surface region on which at least one functional electronic component is arranged,
wherein the second foil substrate comprises a first main surface region and an oppositely arranged second main surface region, wherein at least one functional electronic component is arranged on the first main surface region, and wherein the second foil substrate comprises a cavity comprising at least one opening in the second main surface region,
wherein the foil substrates are arranged one above the other within the foil substrate stack such that the first main surface region of the first foil substrate is opposite the second main surface region of the second foil substrate and the functional electronic component arranged on the first foil substrate is arranged within the cavity provided in the second foil substrate,
wherein the second foil substrate comprises at least one vertical through-connection which extends through the second foil substrate between the first main surface region and the opposite second main surface region,
wherein the second foil substrate additionally comprises at least one conductive trace pattern which extends laterally on the first main surface region of the second foil substrate between the functional electronic component and the at least one through-connection and connects the functional electronic component galvanically to the through-connection,
wherein the first foil substrate comprises at least one conductive trace pattern which extends laterally on the first main surface region of the first foil substrate and galvanically contacts the functional electronic component arranged on the first main surface region of the first foil substrate, and
wherein the vertical through-connection in the second foil substrate galvanically contacts the conductive trace pattern arranged on the first main surface region of the first foil substrate to produce a galvanic connection between the functional electronic component arranged on the first foil substrate and the functional electronic component arranged on the second foil substrate,
wherein the first foil substrate comprises at least one vertical through-connection extending through the first foil substrate between the first main surface region and the opposite second main surface region,
wherein the vertical through-connection in the first foil substrate galvanically contacts the vertical through-connection in the second foil substrate, and
wherein the vertical through-connection in the first foil substrate comprises a first form-fit element, and wherein the vertical through-connection in the second foil substrate comprises a second form-fit element complementary to the first form-fit element, wherein the two form-fit elements are configured to engage in a form-fit manner between the first and second foil substrates.

18. A multi-layer 3D foil package comprising:
a foil substrate stack comprising at least two foil planes, wherein a first electrically insulating foil substrate is arranged in a first foil plane, and wherein a second electrically insulating foil substrate is arranged in a second foil plane,
wherein the first foil substrate comprises a first main surface region on which at least one functional electronic component is arranged,
wherein the second foil substrate comprises a first main surface region and an oppositely arranged second main surface region, wherein at least one functional electronic component is arranged on the first main surface region, and wherein the second foil substrate comprises a cavity comprising at least one opening in the second main surface region,
wherein the foil substrates are arranged one above the other within the foil substrate stack such that the first main surface region of the first foil substrate is opposite the second main surface region of the second foil substrate and the functional electronic component arranged on the first foil substrate is arranged within the cavity provided in the second foil substrate,
wherein the second foil substrate comprises a first and a second foil substrate layer, wherein one of the two foil substrate layers comprises a continuous window opening and the respective other one of the two foil substrate layers comprises a recess, wherein the window opening and the recess together form the cavity.

19. A method for manufacturing a multi-layer 3D foil package, the method comprising:
providing a first electrically insulating foil substrate and a second electrically insulating foil substrate,
arranging at least one functional electronic component on a first main surface region of the first foil substrate,
arranging at least one functional electronic component on a first main surface region of the second foil substrate,
producing a cavity in the second foil substrate such that this cavity comprises at least one opening in a second main surface region opposite the first main surface region of the second foil substrate, and
forming a foil substrate stack by arranging the first and second foil substrates vertically above each other, wherein the foil substrates are arranged one above the other such that the first main surface region of the first foil substrate is opposite the second main surface region of the second foil substrate and the functional electronic component arranged on the first foil substrate is arranged within the cavity provided in the second foil substrate,
wherein producing the cavity in the second foil substrate comprises providing a first foil substrate layer and a second foil substrate layer,
wherein a window opening extending completely through the respective foil substrate layer is introduced into one of the two foil substrate layers and a recess not extending completely through the foil substrate layer is introduced into the respective other foil substrate layer, and wherein subsequently both foil substrate layers are connected to each other to form the second foil substrate,
wherein the window opening in the one foil substrate layer, together with the recess of the respective other foil substrate layer form the cavity in the second foil substrate when the two foil substrate layers are arranged one above the other.

* * * * *